US011970764B2

(12) United States Patent
Ihala Gamaralalage et al.

(10) Patent No.: US 11,970,764 B2
(45) Date of Patent: Apr. 30, 2024

(54) SUPERLUBRICITY COATING CONTAINING CARBON NANOTUBES

(71) Applicant: UT-Battelle, LLC, Oak Ridge, TN (US)

(72) Inventors: Chanaka Kapila Kumara Ihala Gamaralalage, Oak Ridge, TN (US); Jun Qu, Oak Ridge, TN (US); Paul A. Menchhofer, Clinton, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 709 days.

(21) Appl. No.: 17/090,216

(22) Filed: Nov. 5, 2020

(65) Prior Publication Data
US 2021/0222290 A1 Jul. 22, 2021

Related U.S. Application Data

(60) Provisional application No. 62/931,246, filed on Nov. 6, 2019.

(51) Int. Cl.
*B32B 9/00* (2006.01)
*C01B 32/168* (2017.01)
(Continued)

(52) U.S. Cl.
CPC ........ *C23C 16/0218* (2013.01); *C01B 32/168* (2017.08); *C21D 8/0278* (2013.01);
(Continued)

(58) Field of Classification Search
CPC ....... Y10T 428/30; B82Y 30/00; B82Y 40/00; C23C 16/26; C23C 16/0218; C23C 16/52;
(Continued)

(56) References Cited

U.S. PATENT DOCUMENTS 8,052,951 B2 11/2011 Menchhofer et al.
8,268,760 B2 9/2012 Habeeb et al.
(Continued)

OTHER PUBLICATIONS

Blau, P.J., "On the nature of running-in", Tribology International 38 (2005), Available online Aug. 10, 2005, pp. 1007-1012.
(Continued)

*Primary Examiner* — Daniel H Miller
(74) *Attorney, Agent, or Firm* — Scully, Scott, Murphy & Presser, P.C.

(57) ABSTRACT

A method for producing a structure containing an array of MWCNTs on a metal substrate, comprising: (i) subjecting a metal substrate to a surface oxidation process at a first elevated temperature in an oxygen-containing atmosphere and under a first reduced pressure; (ii) subjecting the metal substrate to a surface reduction process at a second elevated temperature in a reducing atmosphere and under a second reduced pressure of at least 0.01 atm and less than 1 atm to result in reduction of the surface of said metal substrate, wherein the reducing atmosphere contains hydrogen gas; (iii) subjecting the metal substrate to a third reduced pressure of no more than 0.1 atm; and (iv) contacting the metal substrate, while at the third reduced pressure and under an inert or reducing atmosphere, with an organic substance at a third elevated temperature for suitable time to produce the MWCNTs on the metal substrate.

15 Claims, 19 Drawing Sheets

(51) Int. Cl.
*C21D 8/02* (2006.01)
*C23C 16/02* (2006.01)
*C23C 16/52* (2006.01)
*C23C 16/56* (2006.01)
*B82Y 30/00* (2011.01)
*B82Y 40/00* (2011.01)

(52) U.S. Cl.
CPC .............. *C23C 16/52* (2013.01); *C23C 16/56* (2013.01); *B82Y 30/00* (2013.01); *B82Y 40/00* (2013.01); *C01B 2202/06* (2013.01); *C01B 2202/08* (2013.01); *Y10T 428/30* (2015.01)

(58) Field of Classification Search
CPC .. C23C 16/56; C01B 2202/06; C01B 2202/08
USPC .......................................... 428/408; 423/448
See application file for complete search history.

(56) References Cited

U.S. PATENT DOCUMENTS

| | | | |
|---|---|---|---|
| 8,455,407 B2 | 6/2013 | Schmidt-Amelunxen et al. | |
| 10,336,618 B1* | 7/2019 | Li | C23C 16/26 |
| 10,661,304 B2* | 5/2020 | Roberts | B05D 1/005 |
| 2013/0136860 A1* | 5/2013 | Chen | H01G 11/46 |
| | | | 427/249.1 |

OTHER PUBLICATIONS

Gui, X., et al., "Carbon Nanotube Sponges", Advanced Materials, 2010, Received Aug. 30, 2009, Published online Nov. 9, 2009, pp. 617-621, 22.

Hashempour, M., et al., "Direct growth of MWCNTs on 316 stainless steel by chemical vapor deposition: effect of surface nano-features on CNT growth and structure", Carbon (2013), Received Mar. 7, 2013, Accepted Jun. 24, 2013, Available online Jul. 4, 2013, pp. 330-347, 63.

Pattinson, S.W., et al., "Mechanism and Enhanced Yield of Carbon Nanotube Growth on Stainless Steel by Oxygen-Induced Surface Reconstruction", Chemistry of Materials 2015, Received Nov. 15, 2014, Revised Dec. 23, 2014, Published Dec. 30, 2014, pp. 932-937, 27.

Zhai, "Carbon nanomaterials in tribology", Carbon 119 (2017), Received Jan. 13, 2017, Received in revised form Apr. 5, 2017, Accepted Apr. 15, 2017, Available online Apr. 21, 2017, pp. 150-171.

Zhuo, C., et al., "Oxidative heat treatment of 316L stainless steel for effective catalytic growth of carbon nanotubes", Applied Surface Science 313 (2014), Received Nov. 4, 2013, Received in revised form Apr. 28, 2014 Accepted May 26, 2014, Available online Jun. 3, 2014, pp. 227-236.

* cited by examiner

SUPERLUBRICITY COATING CONTAINING CARBON NANOTUBES

CROSS REFERENCE TO RELATED APPLICATION

The present application claims benefit of U.S. Provisional Application No. 62/931,246, filed on Nov. 6, 2019, the contents of which are incorporated herein by reference.

STATEMENT REGARDING FEDERALLY SPONSORED RESEARCH

This invention was made with government support under Prime Contract No. DE-AC05-00OR22725 awarded by the U.S. Department of Energy. The government has certain rights in the invention.

FIELD OF THE INVENTION

The present invention generally relates to carbon coatings on metal substrates, and more specifically, where the carbon is in the form of carbon nanotubes. The invention is specifically directed to structures and methods for achieving super-lubricity performance. The present invention also relates to methods for growing carbon nanotubes on metal substrates.

BACKGROUND OF THE INVENTION

The breakdown of mechanical parts due to friction and wear incurs a substantial cost. For example, 10-15% fuel energy is lost to the parasitic friction of automotive vehicles (S. C. Tung et al., *Tribology International*, 37, 517-536, 2004). Based on the latest calculation, tribology (friction, wear, and lubrication) R&D could save 1.0-1.4% of a country's GDP, or one quad energy per year for the U.S. (R. W. Carpick et al., *Tribol. Lubr. Technol.*, 72, 44, 2016). Superlubricious coatings could be considered an effective way of mitigating friction and wear. Superlubricity is defined as a sliding interface experiencing a coefficient of friction (COF) less than 0.01 or nearly frictionless sliding. However, current materials possessing superlubricity are generally limited to the microscopic scale and their manufacture generally requires an ultrahigh vacuum or inert environment, which thus severely limits the practical applications whose bearing components are often of macroscopic scale and operate in ambient environments. Other methods generally employ an external catalyst, such as a metal salt, coated onto the substrate to permit growth of the CNTs. However, it is difficult to control the uniformity and amount of such external catalysts on the substrate surface and there is a cost associated with the application of external catalysts and removal of the excessive salt after the CNT growth.

SUMMARY OF THE INVENTION

The present disclosure is foremost directed to a method for producing a structure in which multi-walled carbon nanotubes (MWCNTs) are bonded to a metal substrate. The structure is typically iron-based or nickel-based. In more typical embodiments, the substrate is a steel, such as a stainless steel, tool steel, or alloy steel. In the structure, the MWCNTs function as a superlubricious coating on the metal substrate. In some embodiments, the lengthwise dimensions of the MWCNTs are aligned substantially perpendicular to a surface of the metal substrate and substantially parallel to each other. In other embodiments, the lengthwise dimensions of the MWCNTs are aligned substantially parallel with a surface of the metal substrate and substantially parallel to each other. In yet other embodiments, the MWCNTs are not aligned with the surface of the metal substrate or to each other. In some embodiments, the process results in a MWCNT-coating of vertically aligned bamboo-like MWCNTs of tens of nanometers in diameter and tens of micrometers in length and with good coverage on the coated surface.

A particularly advantageous aspect of the method described herein is its ability to grow MWCNTs on a metal substrate without employing an external catalyst as conventionally used for initiating the growth of MWCNTs. Another advantage of the process is its ability to produce aligned MWCNTs, either parallel or perpendicular to the substrate surface. Another advantage of the process is that it does not require an ultrahigh vacuum.

More particularly, the method includes the following steps: (i) subjecting a metal substrate to a surface oxidation process in which the metal substrate is subjected to a first temperature of 600-1000° C. in an oxygen-containing atmosphere and under a first reduced pressure of at least 0.01 atm and less than 1 atm to result in oxidation of a surface of the metal substrate, wherein the first temperature is at least 100° C. less than the melting point of the metal; (ii) subjecting the metal substrate to a surface reduction process in which the metal substrate is subjected to a second temperature of 600-1000° C. in a reducing atmosphere and under a second reduced pressure of at least 0.01 atm and less than 1 atm to result in reduction of the surface of the metal substrate, wherein the reducing atmosphere contains hydrogen gas (e.g., 0.1-100%, such as 4%, 20%, and 99%); (iii) subjecting the metal substrate to a third reduced pressure of no more than 0.1 atm; and (iv) contacting the metal substrate, while at the third reduced pressure and under an inert or reducing atmosphere, with an organic substance at a third temperature of 700-900° C. for at least 1 minute, to result in production of the structure containing an array of multi-walled carbon nanotubes on the metal substrate.

In some embodiments, the present disclosure is directed to a coating composed of vertically-aligned MWCNTs, with demonstrated macroscale superlubricity (steady-state COF in the range of 0.001-0.01 in an ambient environment) under either oil-flooded or oil-starved sliding in the ambient environment. The coating composition is thus suitable for addressing friction and wear problems in wide applications, particularly in the case of insufficient lubrication (i.e., "lubricant starvation") or minimum quantity lubrication (MQL). Lubricant starvation can lead to excessive friction, excessive wear, scuffing (form of wear in highly loaded lubricated contacts), and even machine failure. As further discussed below, such a MWCNT coating has herein been produced using a 'catalyst-free' chemical vapor deposition (CVD) process. The MWCNT coating is highly oleophilic, which improves the oil wettability and conserves the oil at the contact interface. The CNT coating is also superhydrophobic, which repels water and prevents moisture-induced corrosion and icing.

Unlike existing technology that typically employs loose CNTs as reinforcement in composite coatings, the presently described coating is composed of MWCNTs that are directly grown and bonded onto the metal surface, and thus imparts the following functionalities to the surface: i) superlubricity, which reduces friction and wear, ii) high oleophilicity, which acts as a lubricant/oil reservoir, thereby minimizing the risk of dry rubbing under lubricant starvation, and iii) superhydrophobicity, which prevents corrosion. The MWCNT coating has wide industrial applications, especially in view of its demonstrated superlubricity in an ambient environment. Potential applicable systems include engine components (e.g., piston-cylinder assemblies), electric cars (e.g., bearings in the electric motor), conventional automotive (e.g., piston ring and skirt in the engine), hydraulics (e.g., as vanes in a vane pump and rollers in a valve-in-start motor), wind turbines (e.g., roller bearings in the gearbox and gears), and gas compressors (e.g., bearings) for improving energy efficiency and durability.

BRIEF DESCRIPTION OF THE DRAWINGS

FIG. 1A shows result on the metal part for temperature ramped from RT to 800° C. in vacuum followed by air oxidation for 10 minutes (as shown, there is no MWCNTs formation). FIG. 1B shows a result on the metal part for temperature ramped from RT to 800° C. in the air allowing oxidation, then kept at 15 minutes at elevated temperature, to form MWCNTs on the surface which makes the surface appear black.

FIGS. 2A-2B. Micrographs showing effect of reduction time duration on MWCNTs growth on a stainless steel (SS) disk. FIG. 2A (left and right panels) shows the result for 30 minute reduction (×50 and ×300 magnification in left and right panels, respectively), whereas FIG. 2B (left and right panels) shows the result using 120 minute reduction (×50 and ×300 magnification in left and right panels, respectively).

FIG. 3A shows the result for 5 minutes of feeding time (with top panel showing overhead view and bottom panel showing in-plane view). FIG. 3B shows the result for 15 minutes of feeding (with top panel showing overhead view and bottom panel showing in-plane view). FIG. 3C shows the result for 60 minutes of feeding (with top panel showing overhead view and bottom panel showing in-plane view). Each top panel also includes an inset photograph of the full object.

FIG. 4A is a simplified schematic of the process for coating a metal substrate with MWCNTs according to the presently described process. FIG. 4B (left and right panels) shows a top view of the MWCNT-coated surface, with the right panel being higher in magnification than the left panel. FIG. 4C (left and right panels) shows a side view of the MWCNT-coated surface, with the right panel being higher in magnification than the left panel.

FIG. 5F is at similar magnification as FIG. 5C but different orientation.

FIG. 7A shows results of using a bottom M2 tool steel disk with a roughness level $R_a$=50 nm. A CNT-coated 316 stainless steel top disk demonstrated an ultra-low steady-state friction coefficient of 0.002-0.007 in 100 m of sliding, a 95-99% reduction compared with 316 stainless steel top disks of uncoated or heat-treated using a similar procedure as the CNT growth but without a carbon source. FIG. 7B shows an ultra-low steady-state friction coefficient of ~0.007 for 1,000 m sliding confirming the sustainability of superlubricity. FIG. 7C shows results of using a M2 tool steel disk with $R_a$=30 nm. A CNT-coated 316 stainless steel top disk demonstrated an ultra-low steady-state friction coefficient of 0.001-0.004 in 100 m of sliding. FIG. 7D shows an ultra-low steady-state friction coefficient of 0.002 for 1,000 m sliding confirming the sustainability of superlubricity.

FIG. 8A (panels i-vi) shows images of the bare Type 316 stainless steel disk (panel i), heat-treated Type 316 stainless steel disk (panel ii), Type 316 stainless steel disk with MWCNTs (panel iii), the M2 tool steel disk which rubbed against the bare Type 316 stainless steel disk (panel iv), the M2 tool steel disk which rubbed against the heated Type 316 stainless steel disk (panel v), and the M2 tool steel disk which rubbed against the Type 316 stainless steel disk with MWCNT coating (panel vi). As shown, the CNT-coated surface and its rubbing counterface showed much less surface damage than those without the CNT coating after tested in oil-started sliding. FIG. 8B (panels i-vi) shows EDS elemental mapping of the M2 tool steel surface that rubbed against the MWCNT coating, with panels i-vi showing images for C, Cr, no element, O, W, and Fe, respectively. As shown, the M2 tool steel surface that rubbed against the CNT-coating has a carbon transfer layer, which is likely at least partly responsible for the ultra-low friction result.

FIG. 9A shows Raman spectra (in the rage of 200-3500 cm$^{-1}$) of as-grown MWCNT-coating and the carbon films on the worn CNT-coated Type 316 stainless steel disk and its counterface M2 tool steel disk after 1,000 m of oil-started sliding. FIG. 9B shows Raman spectra in the range of 1400-1800 cm$^{-1}$.

FIG. 10A includes friction vs. sliding distance plots for Control-1 (bare Type 316 stainless steel disk), Control-2 (heat-treated Type 316 stainless steel disk), and Type 316 stainless steel disk covered by a MWCNT coating under dry sliding. FIG. 10B shows photographs of the Type 316 stainless steel bare disk, heat-treated Type 316 stainless steel disk, and Type 316 stainless steel disk with MWCNT coating and corresponding M2 tool steel disks worn surfaces following the sliding tests.

FIG. 11A shows the MWCNT growth process on Type 316 stainless steel disk using hexane as carbon source. FIGS. 11B-11D are micrographs showing a top view of the MWCNTs grown on a Type 316 stainless steel disk at different magnifications. FIG. 11B: ×300 FIG. 11C: ×10000, FIG. 11D: ×1800.

FIG. 12A shows a simple schematic for a process for growing the MWCNTs on a wire mesh metal substrate. FIG. 12B (panels i-iv) shows SEM images of the resulting MWCNT-coated mesh in ×100, ×300, ×1000, and ×50,000 magnification, respectively in panels i-iv.

FIG. 13A shows a simple schematic for a process for growing the MWCNTs on a Type 316 stainless steel tube. FIG. 13B (panels i-iii) shows SEM micrographs of the outside of the MWCNT-coated Type 316 stainless steel tube, with magnification of ×50, ×1000, and ×5000, respectively, for panels i-iii. FIG. 13C (panels i-iii) shows SEM micrographs of the inside of the MWCNT-coated Type 316 stainless steel tube, with magnification of ×50, ×1000, and ×5000, respectively, for panels i-iii.

FIG. 14A shows a simple schematic for a process for growing the MWCNTs on a D2 tool steel bar. FIG. 14B (panels i-iv) shows SEM images of the resulting MWCNT-coated tool steel bar in increasing magnification, respectively, in panels i-iv.

FIG. 15A shows a simple schematic for a process for growing the MWCNTs on an A2 tool steel bar. FIG. 15B (panels i-iv) shows SEM images of the resulting MWCNT-coated tool steel bar in increasing magnification, respectively, in panels i-iv.

FIG. 16A shows a simple schematic for a process for growing the MWCNTs on an H13 tool steel bar. FIG. 16B (panels i-iv) shows SEM images of the resulting MWCNT-coated tool steel bar in increasing magnification, respectively, in panels i-iv.

FIG. 17A presents SEM micrographs showing the vertically-aligned MWCNTs in the MWCNT coating produced according to the present process. FIG. 17B shows tribo-bench testing results showing superlubricity behavior (defined as COF<0.01) of the CNT coating in macroscale sliding under minimum quantity lubrication (MQL) in an ambient environment. FIG. 17C is a schematic showing hypothetical mechanisms responsible for the superlubricity behavior of the MWCNT coating.

DETAILED DESCRIPTION OF THE INVENTION

Figures 1A, 1B:
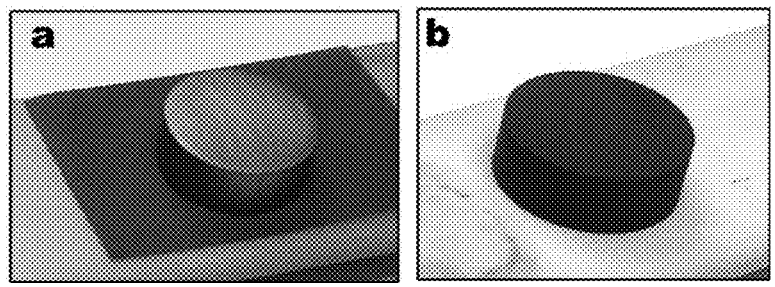
FIGS. 1A-1B. Photographs of metal parts showing effect of temperature ramping environment for MWCNT growth.

In one aspect, the present disclosure is directed to a method for producing a structure in which an array (multiplicity) of multi-walled carbon nanotubes (MWCNTs) are bonded to a metal substrate. For purposes of the invention, the term "bonded" refers to the ability of the MWCNTs to remain affixed to the metal substrate under mild to moderate air or liquid flow. During use, the MWCNTs may break or even fragment into pieces when subjected to substantial frictional forces between metallic parts, but the broken MWCNTs advantageously convert, over time with use, into a durable layered graphitic film with highly effective anti-wear properties.

As well known in the art, MWCNTs are composed of single-wall CNTs nested within each other, wherein each single CNT has a tubular shape with a graphene structure. The MWCNTs may be double-walled, triple-walled, or higher-walled. As also well known, the MWCNTs typically have a length substantially longer than their widths, typically at least or above 1, 2, 10, 20, 30, 40, or 50 microns in length (or any range therein) and up to or less than 20, 30, 40, 50, 60, 70, 80, 90, or 100 nm in diameter (or any range therein). The MWCNTs may or may not be heteroatom-doped, such as with nitrogen, boron, oxygen, sulfur, or phosphorus. The MWCNTs may or may not also be functionalized with any of a variety of hydrophobizing groups, as well known in the art. For purposes of the present invention, the MWCNTs are typically not functionalized with any chemical groups, including hydrophilic or hydrophobic groups. In some embodiments, the lengthwise dimensions of the MWCNTs are aligned substantially perpendicular (i.e., about or precisely 90 degrees) to a surface of the metal substrate and substantially parallel (i.e., about or precisely 0 degrees) to each other. In other embodiments, the lengthwise dimensions of the MWCNTs are aligned substantially parallel with a surface of the metal substrate and substantially parallel to each other. In yet other embodiments, the MWCNTs are not aligned with the surface of the metal substrate or to each other.

The metal substrate can be composed of any one or more elements in their metallic (zerovalent) states. Typically, for purposes of the invention, the metal substrate is a mechanical component that engages in a repetitive frictional interaction with one or more other mechanical components. Particularly as the present invention primarily contemplates directing the MWCNT coating onto mechanical parts, the metal substrate or at least a surface thereof possesses a composition typical of mechanical parts, e.g., by being iron-based, nickel-based, or chromium-based (or at least iron-containing, nickel-containing, or chromium-containing).

In particular embodiments, the metal substrate is a steel. The steel may be, for example, a stainless steel, tool steel, or an alloy steel. For purposes of the invention, the steel preferably contains nickel and/or chromium, in addition to iron as the primary metal component. The nickel and/or chromium has herein been found to be helpful for initiating growth of the MWCNTs, as further discussed below in the method for producing the coating of MWCNTs. As well known, stainless steel contains a significant amount of chromium, generally at least 10, 11, or 12%, typically along with one or more other elements in lesser amounts, such as nickel, molybdenum, aluminum, and titanium. As further well known, alloy steels typically include nickel, copper, chromium, and/or aluminum as alloying elements. As also well known, the tool steel may be classified as a hot-work (Group H) tool steel, which may be further classified as a chromium (H1-H19), tungsten (H20-H39), or molybdenum (H40-H59) hot-work tool steel. The tool steel may alternatively be a cold-work (O, A, or D grade), shock-resistant (S grade), water-hardening (W grade), high-speed (T or M grade), or special purpose tool steel. Depending on the type of tool steel, the tool steel may contain one or more of, for example, tungsten, molybdenum, cobalt, vanadium, and chromium.

In some embodiments, the metal substrate has a smooth surface. The term "smooth," as used herein, may refer to a planar or curved surface and indicates a substantial absence of protrusive or depressive features of at least 0.5 or 1 micron in size on the surface of the metal substrate. For purposes of the invention, the metal substrate may be considered smooth even if it contains protrusive or depressive features up to or smaller than 0.5 or 1 micron in size. The smooth metal substrate can be either planar or curved on a macroscopic scale (e.g., when viewed over at least 1 mm or 1 cm). By virtue of the very small size (or more specifically, widths) of the MWCNTs, even a curved metal surface will appear planar at microscopic range. The metal substrate may have any suitable shape and size dependent on its function and use. The metal substrate may also be treated to confer it with a desired smoothness, such as by polishing to reach a roughness value ($R_a$) of about, no more than, or less than 100 nm, 50 nm, or 20 nm.

In some embodiments, the array of MWCNTs is coated with a film of oil, wherein the oil is typically a mechanical lubricating oil. The film of oil may have a thickness of, for example, up to or less than 1, 2, 5, 10, 20, 50, 100, 200 or 500 nm. The mechanical lubricating oil can be further classified as, for example, an engine (motor) lubricating oil, industrial lubricating oil, or metal working fluid. The classification, uses, and properties of such oils are well known in the art, as provided by, for example, U.S. Pat. No. 8,268,760, the contents of which are herein incorporated by reference in their entirety. In particular, the oil may belong to any of the well established five categories of hydrocarbon oils (i.e., Groups I, II, III, IV, or V) classified according to the extent of saturates, sulfur, and viscosity index. The oil can have any of the typical boiling points, e.g., at least 100, 120, 150, 180, or 200° C. and up to 250, 300, 350, 400, 450, or 500° C. In some embodiments, the oil is a synthetic oil, such as any of the Groups I-V, and may or may not include polyalphaolefins (PAO). Some other synthetic oils include hydrogenated polyolefins, esters, fluorocarbons, and silicones. In other embodiments, the oil may be natural, such as a mineral oil, vegetable oil, or animal oil. In yet other embodiments, the oil may have a substantially high enough viscosity to qualify it as a grease, wherein the grease typically lowers in viscosity during use by virtue of heat generated during use.

The oil may or may not be admixed with any one or more lubricant additives well known in the art. The term "additive", as used herein, is understood to be a compound or material, or mixture of compounds or materials, that provides an adjunct or auxiliary effect at low concentrations, typically up to or less than 1, 2, 5, 7, or 10 wt % by weight of the lubricant composition. The additive can be, for example, an anti-wear additive (typically metal-containing), extreme pressure additive, metal chelator, ultraviolet stabilizer, radical scavenger, anti-oxidant, corrosion inhibitor, friction modifier, detergent, surfactant, anti-foaming agent, viscosity modifier (viscosity index improver), or anti-foaming agent, or combination thereof, all of which are well known in the art, as further described in U.S. Pat. Nos. 8,455,407 and 8,268,760, both of which are herein incorporated by reference in their entirety.

In some embodiments, the additive is a metal-containing dithiophosphate, sulfur-containing fatty acid or ester thereof, dialkyl sulfide, dithiocarbamate, polysulfide, or boric acid ester. In further embodiments, the additive is a metal-containing dialkyldithiophosphate or dialkyldithiocarbamate, wherein the metal is typically zinc or molybdenum, as in zinc dialkyldithiophosphate (ZDDP) or molybdenum dialkyldithiocarbamate (MoDTC), and the alkyl groups typically include between 3 and 12 carbon atoms and can be linear or branched. The additive can be included in the oil in any suitable amount typically used in the art, such as between 0.1 and 15 wt %.

In another aspect, the present disclosure is directed to a method for producing the structure described above. Notably, the present method does not employ externally provided particles having a metallic, metal salt, or metal oxide composition, as sometimes employed in the art, as initiation sites for growth of CNTs or MWCNTs. For this reason, the present disclosure also refers to the method as a catalyst-free chemical vapor deposition process. As further discussed below, instead of using externally provided catalyst particles, the present method employs a series of oxidation and reduction steps on the substrate, which result in in situ production of metallic, metal salt, or metal oxide catalytic particles that function as initiation sites for growth of the MWCNTs. The in situ produced catalytic particles are typically composed of iron, nickel, or combination of iron and nickel, or alternatively, iron oxide, nickel oxide, or combination of iron and nickel oxides.

In a first step (step i) of the process, the metal substrate is subjected to a surface oxidation process in which the metal substrate is subjected to a first temperature of 600-1000° C. in an oxygen-containing atmosphere and under a first reduced pressure of at least 0.01 atm or 0.1 atm and less than 1 atm to result in oxidation of the surface of the metal substrate. The first temperature, besides being in a range of 600-1000° C., is also at least 100° C. below the melting point of the metal of the metal substrate. In different embodiments, and depending on the composition of the metal and other factors, the first temperature is precisely or about, for example, 600° C., 650° C., 700° C., 750° C., 800° C., 850° C., 900° C., 950° C., or 1000° C., or a temperature within a range bounded by any two of the foregoing values, e.g., 600-900° C., 700-900° C., or 750-850° C. In typical embodiments, the metal substrate is raised gradually in temperature to a maximum first temperature from a first lower temperature. The first lower temperature is typically at or about room temperature, e.g., about 15-30° C. or about 20° C. or 25° C. The metal substrate may be raised gradually at a temperature ramp rate of or no more than, for example, 5° C./min, 10° C./min, 15° C./min, 20° C./min, 25° C./min, 30° C./min, 40° C./min, or 50° C./min, or a range in ramp rate bounded by any two of the foregoing values, e.g., 5-50° C./min or 10-30° C./min. In some embodiments, the metal substrate is maintained at any of the first (or first maximum) temperatures provided above for a period of time capable of oxidizing the metal substrate surface, e.g., at least or more than 5, 10, 15, 20, or 30 minutes (e.g., 750° C., 800° C., or 850° C. for 10, 15, or 20 minutes). The oxygen-containing atmosphere may be, for example, natural air or an artificial oxygen-containing atmosphere, such as oxygen-enriched air or a mixture of oxygen and an inert gas (typically at least or above 10, 15, or 20 vol % oxygen). The first reduced pressure may be precisely or about, for example, 0.01, 0.05, 0.1, 0.2, 0.5, 0.8, or 0.9 atm, or a pressure within a ranged bounded by any two of the foregoing values, e.g., 0.01-0.9 atm, 0.1-0.9 atm, 0.01-0.5 atm, or 0.1-0.5 atm.

In a second step (step ii) of the process, the metal substrate is subjected to a surface reduction process in which the metal substrate is subjected to a second temperature of 600-1000° C. in a reducing atmosphere and under a second reduced pressure of at least 0.01 atm and less than 1 atm to result in reduction of the surface of the metal substrate. Notably, since a reducing gas is used in the second step, the oxidizing gas used in the first step needs to be replaced with the reducing gas. For example, the oxidizing gas may be directly flushed out with the reducing gas, or the oxidizing gas may be first removed by applying a vacuum followed by influx of the reducing gas. In different embodiments, the second temperature is precisely or about, for example, 600° C., 650° C., 700° C., 750° C., 800° C., 850° C., 900° C., 950° C., or 1000° C., or a temperature within a range bounded by any two of the foregoing values, e.g., 600-900° C., 700-900° C., or 750-850° C. The first and second temperatures are independently selected, and thus, may be the same or different. Typically, the second temperature is applied while the metal substrate is still at an elevated temperature from the first step, which thus may require only a slight or no temperature increase from the first to the second temperature. Where the second temperature is higher than the first temperature, a gradual temperature increase may be employed, as described above. In some embodiments, the first temperature may be lowered from a first maximum temperature before being raised to a second maximum temperature. In some embodiments, the metal substrate is maintained at any of the second (or second maximum) temperatures provided above for a period of time capable of reducing the metal substrate surface, e.g., at least or more than 5, 10, 15, 20, or 30 minutes (e.g., 750° C., 800° C., or 850° C. for 10, 15, or 20 minutes). The reducing atmosphere typically contains hydrogen gas, either in pure form or in admixture with an inert gas, e.g., at least 1, 4, 10, 20, 30, 40, 50, 60, 70, 80, 90, or 99 vol % hydrogen, or range therein. The second reduced pressure may be precisely or about, for example, 0.01, 0.05, 0.1, 0.2, 0.5, 0.8, or 0.9 atm, or a pressure within a ranged bounded by any two of the foregoing values, e.g., 0.01-0.9 atm, 0.1-0.9 atm, 0.01-0.5 atm, or 0.1-0.5 atm. The first and second reduced pressures may be the same or different.

In a third step (step iii) of the process, the metal substrate is subjected to a third reduced pressure of no more than 0.1 atm. In different embodiments, the metal substrate is subjected to a third reduced pressure of no more than or less 0.1, 0.05, 0.01, 0.005, or 0.001 atm (about 1 torr), or a third reduced pressure within a range bounded by any two of the foregoing values, e.g., 0.001-0.1 atm or 0.001-0.01 atm. The third reduced pressure may be the same or different than the second reduced pressure. In some embodiments, the third reduced pressure is lower than the second reduced pressure or lower than both the first and second reduced pressures. Generally, the temperature in step (iii) is within the useful range in step (ii). The temperature is step (iii) may be the same or different than the temperature used in step (ii).

In a fourth step (step iv) of the process, while at the third reduced pressure and under an inert or reducing atmosphere, the metal substrate is contacted with an organic substance at a third temperature of 700-900° C. for at least 1 minute to result in production of the array of multi-walled carbon nanotubes (MWCNTs) on the metal substrate. Typically, after step (iv), a step (v) is employed in which the metal substrate is cooled to room temperature under an inert or reducing atmosphere.

In different embodiments, the third temperature employed in step (iv) is precisely or about, for example, 700° C., 750° C., 800° C., 850° C., or 900° C., or a temperature within a range bounded by any two of the foregoing values, e.g., 700-900° C., 750-850° C., or 750-900° C. The second and third temperatures are independently selected, and thus, may be the same or different. Typically, the third temperature is applied while the metal substrate is still at an elevated temperature from the third step, which thus may require only a slight or no temperature increase from the second to third temperature. Where the third temperature is higher than the second temperature, a gradual temperature increase may be employed, as described above. It is also possible for the third temperature to be lower than the second temperature, in which case the metal substrate would need to be cooled to reach the third temperature. In some embodiments, the second temperature may be lowered from a second maximum temperature before being raised to the third temperature.

Step (iv) employs a reducing or inert atmosphere. The reducing atmosphere typically contains hydrogen gas, either in pure form or in admixture with an inert gas, e.g., at least 1, 4, 10, 20, 30, 40, 50, 60, 70, 80, 90, or 99 vol % hydrogen, or range therein. An inert atmosphere is composed entirely of one or more inert gases, such as nitrogen, helium, and/or argon.

The term "at least 1 minute," as used in step (iv), refers to the amount of time the organic substance is flowing toward and making contact with the metal substrate under the conditions discussed above in step (iv). As the organic substance makes contact with the metal substrate, the organic substrate is converted into MWCNTs, which grow over time as long as more organic substance continues to be fed to the metal substrate under the conditions discussed above for step (iv). Depending on the length of MWCNTs desired, the organic substance may continue to flow and make contact with the metal substrate for a time of at least 2, 5, 10, or 15 minutes, or longer. In some embodiments, the conditions in step (iv) wherein the multi-walled carbon nanotubes are aligned substantially perpendicular to said metal substrate and substantially parallel to each other. The distribution of self-grown catalyst nanoparticles has herein been found to play a major role in the alignment of the MWCNTs. A low-density distribution of catalyst particles generally leads to random alignment of the MWCNTs whereas a high-density or closely-packed distribution of catalyst particles results in aligned MWCNTs perpendicular to the substrate. In addition, the application of an external force during growth may further control the alignment of MWCNTs with respect to the substrate surface. Some examples of external forces include directional gas flow, electric field alignment, and plasma treatment. In some embodiments, an external force during MWCNT is not used.

The term "organic substance," as used in step (iv), refers to a substance containing carbon, wherein the carbon is not in its elemental form. Thus, the organic substances may also be considered organic compounds, wherein the organic compounds typically include at least one carbon-hydrogen bond. In typical embodiments, the organic substance has a molecular weight of up to 150 g/mol, 250 g/mol, 500 g/mol, 1000 g/mol, 1500 g/mol, or 2000 g/mol. In different embodiments, the organic substance may have a boiling point of about, up to, or less than, for example, 50, 60, 70, 80, 90, 100, 120, 150, or 200° C., or a boiling point within a range bounded by any two of the foregoing values.

In one set of embodiments, the organic substance used in step (iv) is a hydrocarbon, which is composed of only carbon and hydrogen atoms. Some examples of organic substances containing only carbon and hydrogen include: (i) linear, branched, or cyclic alkanes; (ii) linear, branched, or cyclic alkenes; (iii) alkynes; and (iv) aromatic compounds. Some examples of alkanes that may be function as an organic substance in step (iv) include methane, ethane, propane, n-butane, isobutane, n-pentane, isopentane, n-hexane, 2-methylpentane (isohexane), 3-methylpentane, n-heptane, isoheptane, n-octane, isooctane, cyclopentane, and cyclohexane. Some examples of alkenes that may be function as an organic substance in step (iv) include ethylene, propylene, 1-butene, 2-butene, 1-pentene, 2-pentene, 2-methyl-2-butene, 1-hexene, 2-hexene, 3-hexene, 2,3-dimethyl-2-butene, 1,3-butadiene, 1-hexene, 2-hexene, 3-hexene, 1,3,5-hexatriene, cyclopentene, cyclohexene, and 1,4-cyclohexadiene. Some examples of alkynes that may be function as an organic substance in step (iv) include acetylene, propyne, and butyne. Some examples of aromatic compounds that may be function as an organic substance in step (iv) include benzene, toluene, o-, m-, or p-xylene, naphthalene, anthracene, and phenanthrene. In some embodiments, any one or more of the foregoing classes or specific types of organic substances are excluded from step (iv).

In another set of embodiments, the organic substance used in step (iv) contains at least one type of heteroatom (for example, oxygen, nitrogen, sulfur, phosphorus, boron, or silicon) in addition to carbon and hydrogen atoms. Some examples of heteroatom-containing organic substances include: (i) alcohols; (ii) ketones; (iii) aldehydes; (iv) ethers; (v) esters; (vi) carboxylic acids; (vii) organoamines; (viii) amides; (ix) nitriles; (x) organophosphines; (xi) organothiols; (xii) organosulfides; (xiii) organoboranes; and (xiv) organosilanes. Some examples of alcohols include methanol, ethanol, n-propanol, isopropanol, n-butanol, isobutanol, t-butanol, n-pentanol, isopentanol, 2-pentanol, 3-pentanol, 1-hexanol, 2-hexanol, 3-hexanol, isohexanol, 1-octanol, ethylene glycol, propylene glycol, vinyl alcohol, allyl alcohol, isoprenol, phenol, and catechol. Some examples of ketones include acetone, 2-butanone (methyl ethyl ketone), 2-pentanone, 3-pentanone, 2,4-pentanedione, 2-hexanone, 3-hexanone, cyclohexanone, and methyl vinyl ketone. Some examples of aldehydes include formaldehyde, acetaldehyde, propionaldehyde, butyraldehyde, benzaldehyde, furfural, glyoxal, malondialdehyde, succindialdehyde, and acrolein. Some examples of ethers include diethyl ether, diisopropyl ether, anisole, and dimethoxyethane. Some examples of esters include methyl formate, ethyl formate, methyl acetate, ethyl acetate, propyl acetate, butyl acetate, and methyl benzoate. Some examples of carboxylic acids include formic acid, acetic acid, propionic acid, butyric acid, malonic acid, succinic acid, and benzoic acid. Some examples of organoamines include methylamine, dimethylamine, trimethylamine, ethylamine, diethylamine, triethylamine, n-propylamine, n-butylamine, n-hexylamine, N,N-dimethylhexylamine, triphenylamine, piperidine, piperazine, pyridine, and pyrazine. Some examples of amides include dimethylformamide, dimethylacetamide, and dimethylacetamide. Some examples of nitriles include acetonitrile, propionitrile, butyronitrile, and benzonitrile. Some examples of organophosphines include triethylphosphine and triphenylphosphine. Some examples of organothiols include methanethiol, ethanethiol, propanethiol, butanethiol, allyl mercaptan, and thiophenol. Some examples of organosulfides (thioethers) include dimethylsulfide, ethyl methyl sulfide, diphenyl sulfide, and disulfide compounds. Some examples of organoboranes include triethylborane, tributylborane, and triphenylborane. Some examples of organosilanes include tetramethylsilane, tetraethylsilane, and tetraphenylsilane. In some embodiments, any one or more of the foregoing classes or specific types of organic substances are excluded from step (iv).

In some embodiments, after the MWCNTs are grown on the surface of the metal substrate, the MWCNT-coated metal substrate is subjected to an annealing step, also herein referred to as a post-annealing step. The annealing step may result in greater adherence of the MWCNTs to the metal surface. In the annealing step, the MWCNT-coated metal substrate is treated at an annealing temperature, which, as well known in the art, is a temperature above the recrystallization temperature of the metal, and at which the metal softens without fully melting. As each metal has its own unique melting point and recrystallization temperature, each metal may have a different suitable range in temperature for the annealing process. The annealing temperature may be, for example, about 50, 100, 200, 300, 400, or 500° C. below the melting point of the metal. Depending on the metal, the annealing step may be conducted at about 500° C., 600° C., 700° C., 800° C., 900° C., 1000° C., or a temperature within a range bounded by any two of the foregoing temperatures. Generally, the MWCNTs are stable up to a temperature of about 2700° C. However, the annealing process will generally employ a temperature of up to or less than 1300° C. depending on the substrate used for MWCNTs growth. Generally, the annealing process is conducted for sufficient time to result in diffusion of metal to permit sealing in the region where the carbon nanotubes and metal are bonded. The annealing step is typically conducted under an inert or reduced oxygen atmosphere. The reduced oxygen level may be achieved by, for example, using an atmosphere primarily composed of an inert gas and/or reducing gas. Alternatively, or in addition, the reduced oxygen level may be achieved by lowering the atmosphere pressure to below ambient pressure (i.e., below 1 atm). The pressure may be lowered to, for example, 0.5 atm, 0.1 atm, 0.01 atm, 0.001 atm, 0.0001 atm, or lower.

In another aspect, the invention is directed to methods for using the above-described MWCNT coating for reducing wear and/or reducing friction in a mechanical device for which lubricity is beneficial. The mechanical device may be, for example, a bearing (e.g., a slide bearing, ball bearing, rolling element bearing, or jewel bearing), piston, turbine fan, rotary blade, compressor blade, gear, axle, engine part (e.g., engine valve, piston, cylinder, or transmission), hydraulic system, or metal cutting tool or machine. The parts being lubricated are typically constructed of a metal or metal alloy, as described above. The metal or metal alloy may be or include, for example, steel, iron, aluminum, nickel, titanium, or magnesium, or a composite or alloy thereof.

Examples have been set forth below for the purpose of illustration and to describe certain specific embodiments of the invention. However, the scope of this invention is not to be in any way limited by the examples set forth herein.

EXAMPLES

Process for Coating Steel Substrates with Vertically Aligned MWCNTs

The following experiments describe a novel process for producing a coating composed of vertically-aligned MWCNTs, with demonstrated macroscale superlubricity (steady-state COF in the range of 0.001-0.01) under oil-starved sliding in the ambient environment. The MWCNT coating was produced using a 'catalyst-free' chemical vapor deposition (CVD) process. As the MWCNT coating is highly oleophilic, it substantially improves the oil wettability and conserves the oil at the contact interface. The MWCNT coating is also superhydrophobic, which prevents moisture-induced corrosion and icing. This technology may be used in a wide variety of industrial applications, such as engine components, including piston-cylinder assemblies, wind turbine bearings, gears, and manufacturing machinery where lubricant starves.

The MWCNT coating possesses macroscale superlubricity with a typical steady-state COF of 0.001 to 0.01 in the ambient environment, and thus, is suitable for addressing friction and wear problems in wide applications, particularly where insufficient lubrication (aka lubricant starvation) may cause damage. Lubricant starvation can lead to high friction, excess wear, scuffing (form of wear in highly loaded lubricated contacts), and sometimes machine failure.

Unlike existing technology that uses loose CNTs as reinforcement in composite coatings, this new coating is composed of vertically aligned CNTs that are directly grown and bonded onto the metal surface, and thus imparts the following functionalities to the surface: i) superlubricity, which reduces friction and wear; ii) high oleophilicity, which functions as a lubricant/oil reservoir, thereby minimizing the risk of dry rubbing under lubricant starvation; and iii) superhydrophobicity, which helps to prevent corrosion.

The CNT coating has wide industrial applications, especially due to its demonstrated superlubricity in an ambient environment. Applicable systems include electric cars (such as bearings in the e-motor), conventional automotives (such as piston ring and skirt in the engine), hydraulics (such as vanes in a vane pump and rollers in a valve-in-start motor), wind turbines (such as roller bearings in the gearbox), and gas compressors (such as bearings) for improving energy efficiency and durability.

The CVD process described herein results in a MWCNT coating of vertically aligned bamboo-like MWCNTs of tens of nanometers in diameter and tens of micrometers in length and has good coverage on the coated surface. The CVD process described herein is unique in at least the following two ways: (i) unlike conventional methods that employ catalytic nanoparticles on the surface of the metal substrate to grow CNTs, this new method does not require such external catalyst, for which reason the present process is herein referred to as a 'catalyst-free' process, and (ii) unlike the randomly oriented CNTs grown by conventional methods, the MWCNTs grown by the present process can be made to be aligned, and particularly, vertically aligned.

In the following experiment, MWCNTs were grown onto a Type 316 stainless steel (SS) disk (10 mm in diameter and 3 mm thick). The 316 stainless steel disk was first polished to a roughness ($R_a$) of ~50 nm using SiC grinding paper. The disk was then inserted into the CVD tubing. The CVD process included five stages: (1) the 316 stainless steel disk was subjected to thermal treatment from room temperature (RT) to 800° C. in the air over 30 minutes at 260-300 Torr under temperature ramping from 10-40° C./min. The temperature was maintained at 800° C. for 15-45 minutes to oxidize the disk surface; (2) the system was subjected to a vacuum (1-10 torr) to remove the air and was maintained at that vacuum for at least 2-5 minutes before switching the CVD chamber to a reduced environment by supplying Ar/$H_2$ (flow rate of 50-100 CCM or higher). The CVD chamber pressure was brought to 500-700 torr to improve reduction and was maintained at 800° C. for 30-120 minutes; (3) Ar/$H_2$ flow was stopped and the CVD chamber was vacuumed down to ~1-10 Torr; (4) Ethanol (EtOH) was introduced for 15-60 minutes at 800° C.; and (5) finally, heating was discontinued to allow the system to cool down to RT under Ar/$H_2$ flow at 50-100 CCM. In the foregoing overall process, the alloy surface was oxidized and then reduced, which resulted in the production of catalytic nanoscale features on the surface to initiate the growth of CNTs.

The surface coverage of MWCNTs was found to be improved by increasing the reduction time. Several trials were conducted to increase the length of the MWCNTs, but the maximum length was still limited to about 30 μm. This is possibly due to the deactivation of the catalyst particles shortly after the carbon source introduction.

Effect of heating step: Several heating rates were applied to better understand the impact of the oxidative surface preparation stage on MWCNT growth. A ~25° C./min or lower heating rate was found to be best to improve the surface coverage of the CNTs.

Temperature ramping environment: The initial temperature ramping environment was found to be critical for MWCNTs growth. FIG. 1A shows the result on the metal part (SS disk) for temperature ramped from RT to 800° C. in vacuum followed by air oxidation for 10 minutes (as shown, there is no MWCNTs formation). FIG. 1B shows result on the metal part for temperature ramped from RT to 800° C. in the air, then kept at 15 minutes at elevated temperature. The above demonstrates that there was no MWCNT formation if the Type 316 stainless steel disk was subjected to air oxidation at 800° C. without using a temperature ramping from RT under air supply. The formation of in situ-produced catalyst particles (i.e., "self-catalyst particles") with oxidation may require slow development and surface rearrangement over the temperature gradient.

Figures 2A, 2B:
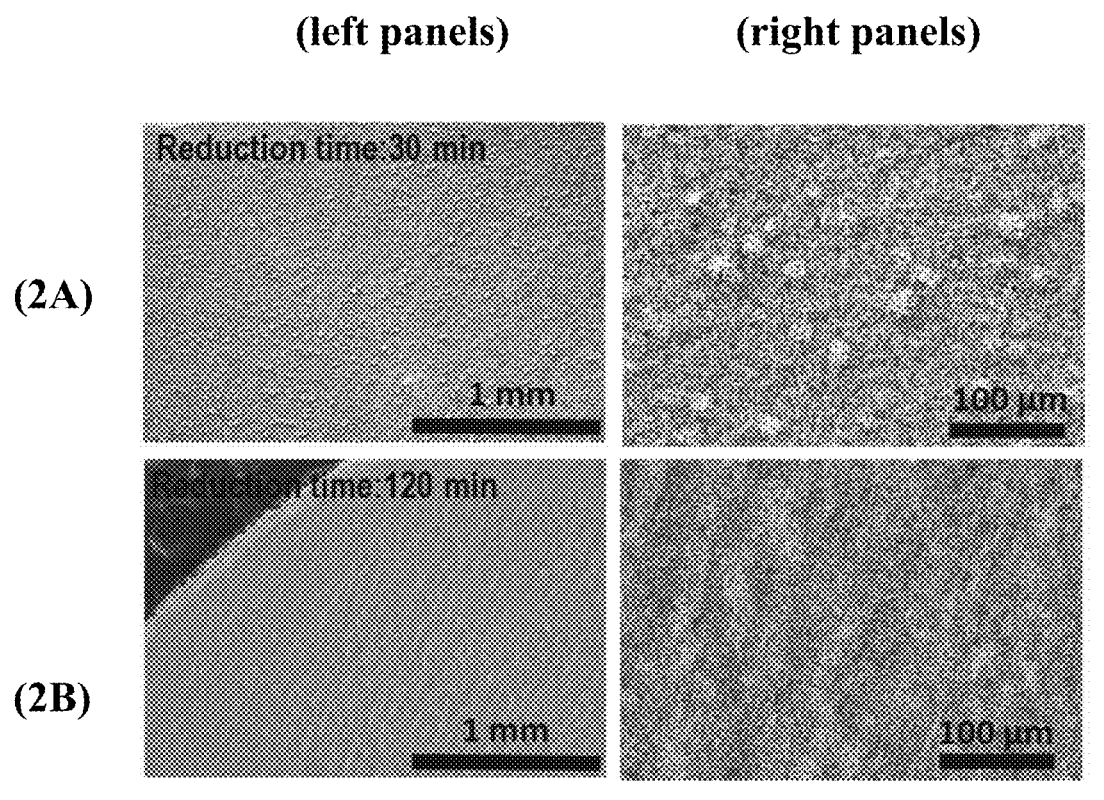

Effect of reduction time: The reducing step improves the activity of the catalyst particles generated during the oxidation step. The distribution and activity of the surface generated nanoparticles may vary due to the heterogeneous nature of the surface. This triggers the variation in self-catalyst nanoparticles distribution and growth mechanism, which increases the waviness of the MWCNT coating, as evidenced in the micrographs in FIG. 2A. However, an increased reduction time (e.g., 30 min vs. 120 min) will bring the catalyst particles to a similar activity level, and it improves uniform MWCNT growth, as evidenced in the micrographs in FIG. 2B.

Figures 3A, 3B, 3C:
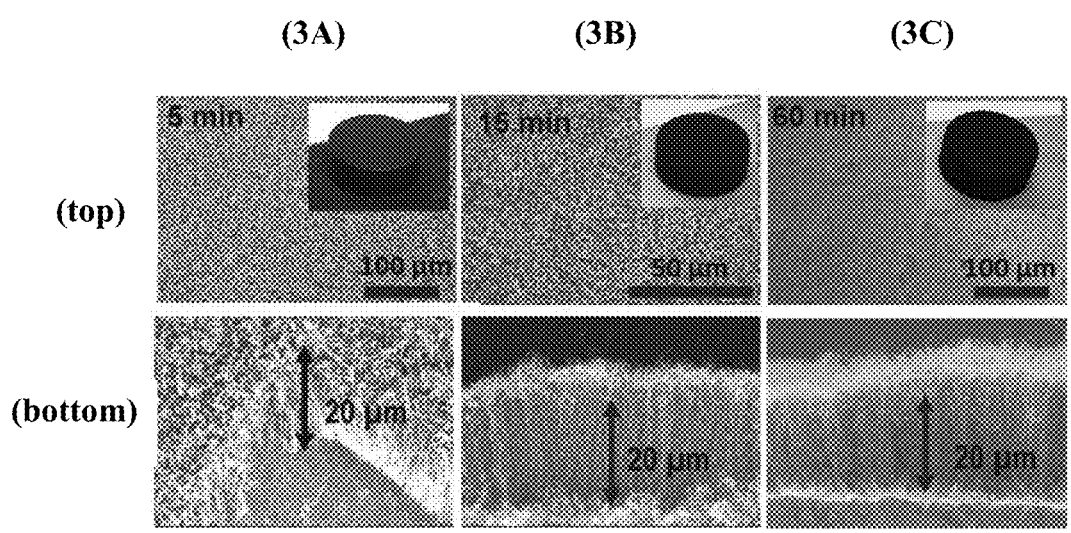
FIGS. 3A-3C. Micrographs showing effect of ethanol feeding time on MWCNTs growth on a metal substrate.

Effect of EtOH introduction time: Different EtOH introduction times were attempted in an effort to understand the effect of carbon source feeding time on the MWCNTs length. As evidenced in the micrographs in FIGS. 3A-3C, the length of MWCNTs remained in the rage of 15-30 μm even when feeding time was varied from 5 minutes, 15 minutes, and 60 minutes. This result is possibly due to the deactivation of catalyst particles shortly after the carbon source exposure, either by formation of metal carbide or formation of a layer of amorphous carbon.

Characterization

Figures 4A, 4B, 4C:
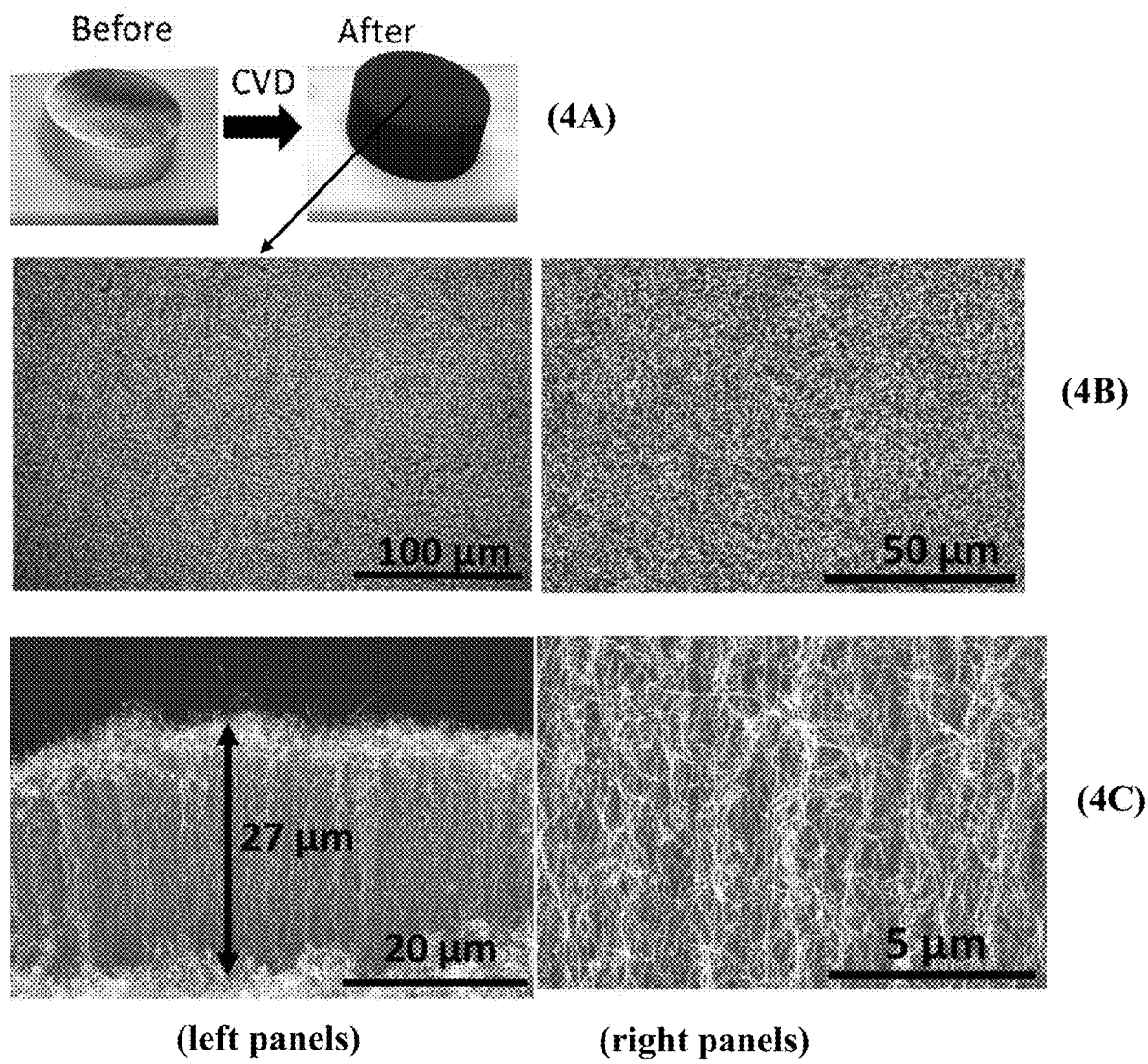
FIGS. 4A-4C.

FIG. 4A shows a Type 316 stainless steel disk before and after the CVD process. The entire surface appears to be black after the process, which indicates a good coating coverage. SEM examination revealed a vertically-aligned MWCNT array grown on the Type 316 stainless steel surface, as shown in the micrographs in FIGS. 4B and 4C. FIG. 4B (left and right panels) shows the top views of the MWCNT array, while FIG. 4C shows the side view. The thickness of the MWCNT coating (or the length of MWCNTs) is about 20-30 μm for this particular sample. The diameters of the MWCNTs are generally in the range of 40-50 nm. The MWCNTs' length and diameter can be controlled by adjusting the oxidation time, oxidation temperature, reduction time, and reduction temperature. The substrate alloy composition influences the MWCNTs growth as well. To achieve a full surface coverage of MWCNTs, the reduction time and chamber pressure have been found to play important roles. For example, a similar experiment performed with a lower CVD chamber pressure (~5 Torr for 30 minutes reduction time) resulted in an uneven surface coverage of MWCNTs.

Figure 5A:
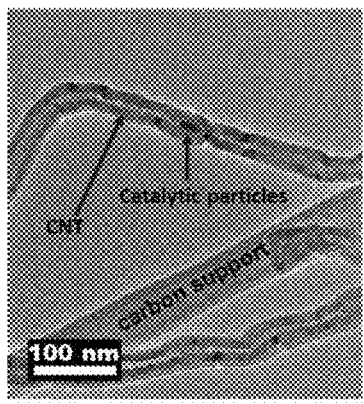
FIGS. 5A-5F. Transmission electron microscope (TEM) images of the MWCNTs grown on a metal disk, with magnification increasing from FIG. 5A to FIG. 5E.
Figure 5B:
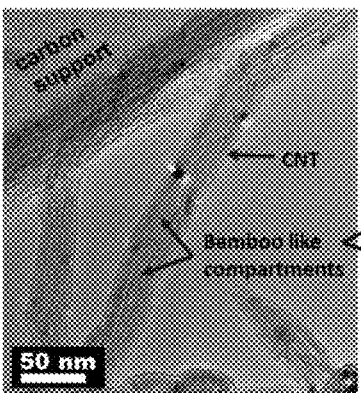
Figure 5C:
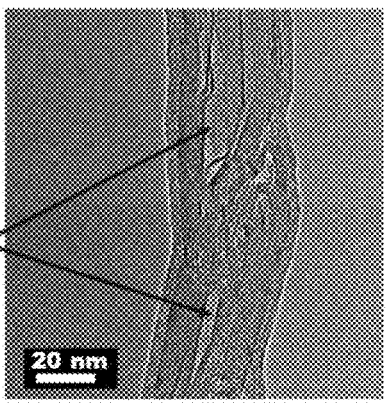
Figure 5D:
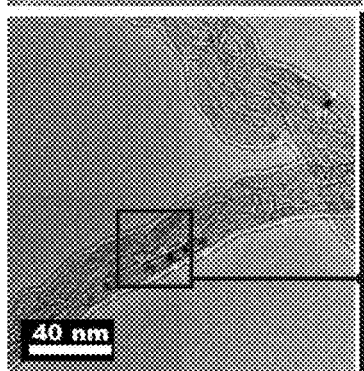
Figure 5E:
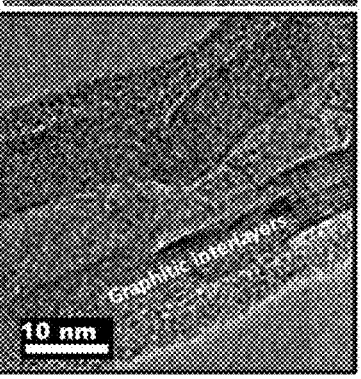
Figure 5F:
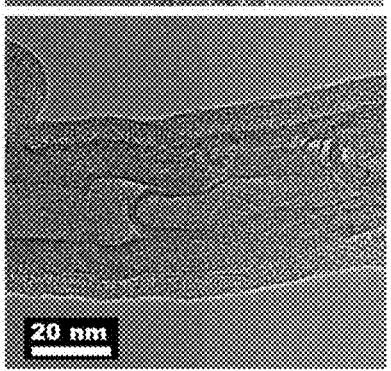

FIGS. 5A-5F show the transmission electron microscopy (TEM) images of the MWCNTs grown on a 316 SS disk, with magnification increasing from FIG. 5A to FIG. 5E, and with FIG. 5F at similar magnification as FIG. 5C but different orientation. Instead of a continuous hollow tube, as commonly observed in CNTs or MWCNTs in the literature, bamboo-like compartments are found in the MWCNTs produced by the presently described process. The formation of such a bamboo-like CNTs is possibly due to the carbon bulk diffusion through the catalytic particles. Some catalytic particles were trapped inside the MWCNTs during the growth. Graphitic interlayers with parallel lattice fringes are clearly visible in the high magnification TEM images.

Oleophilicity and Hydrophobicity

Figures 6A, 6B, 6C, 6D:
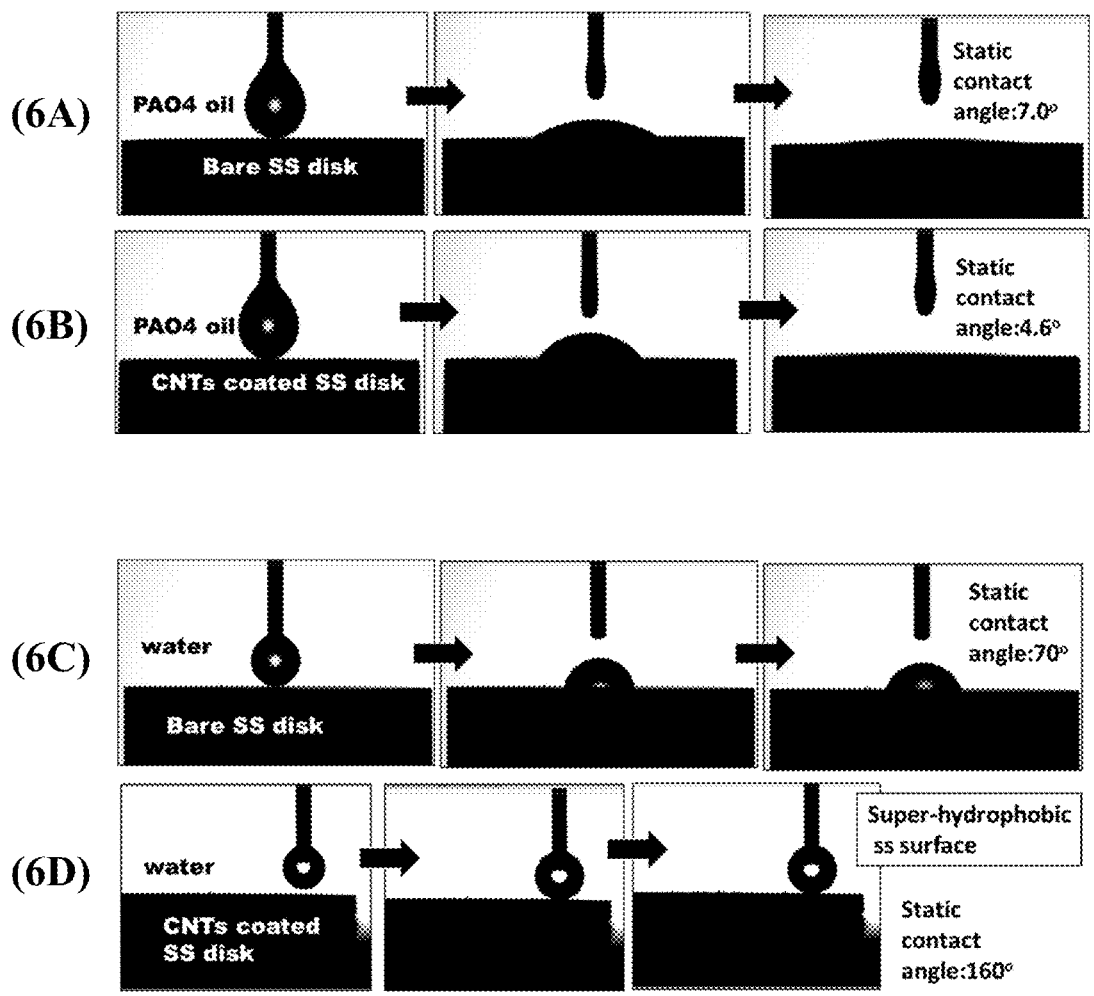
FIGS. 6A-6D. Schematics showing contact angels for: PAO4 base oil on a bare metal disk (FIG. 6A), PAO4 oil on MWCNT-coated metal disk (FIG. 6B), water on bare metal disk (FIG. 6C), and water on MWCNT-coated metal disk (FIG. 6D).

The array of MWCNTs advantageously functions as an oil reservoir due to its high oleophilicity. This property advantageously avoids dry rubbing. The oleophilic and superhydrophobic nature of the MWCNTs is shown in FIGS. 6A-6D. The static contact angles of a synthetic base oil (PAO 4 cSt) and de-ionized water were measured on bare and MWCNT-coated 316 stainless steel surfaces. FIGS. 6A-6D re schematics showing contact angels for: PAO4 oil on bare stainless steel disk (FIG. 6A), PAO4 oil on MWCNT-coated stainless steel disk (FIG. 6B), water on bare stainless steel disk (FIG. 6C), and water on MWCNT-coated stainless steel disk (FIG. 6D). The contact angle of the PAO oil drops was reduced from 7° on the bare stainless steel disk to 4.6° on the MWCNT-coated stainless steel disk, suggesting an improved oil wettability, as shown in FIG. 6A. On the other hand, as shown in FIG. 6B, the MWCNT coating increased the water contact angle from 70° on the bare stainless steel disk to 160° on the coated stainless steel disk, thereby changing the stainless steel surface from hydrophilic to superhydrophobic.

Tribological Performance

Figure 7A:
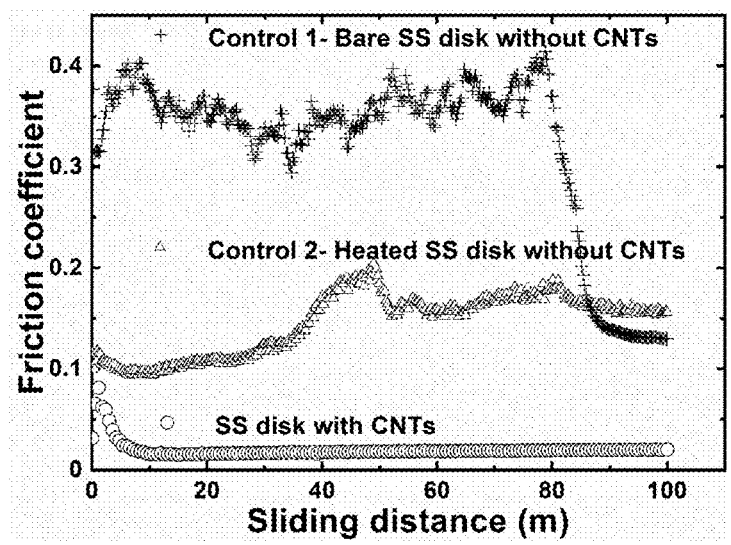
FIGS. 7A-7D. Friction vs. sliding distance plots showing that the MWCNT coating demonstrated repeatable, long-term superlubricity in lubricant-starved sliding. Bench-scale tribo-testing using a top Type 316 stainless steel disk (with or without a CNT-coating) reciprocating sliding against a bottom stationary M2 tool steel disk lubricated by one droplet of oil at a 100 N load and a 0.5 Hz oscillation frequency with a 10 mm stroke in an ambient environment. Surface roughness of the top 316 stainless steel disk $R_a$=50 nm whereas the bottom stationary M2 tool steel disk with two levels of surface roughness $R_a$=50 or 30 nm.
Figure 7B:
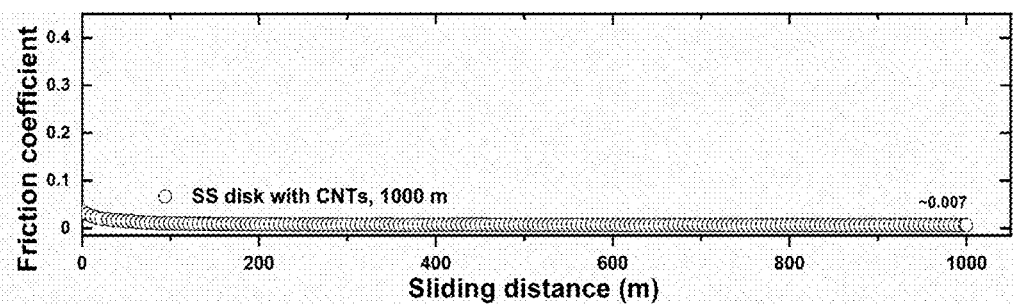

The measure of the superlubricity of the MWCNT coating is shown in the friction vs. sliding distance plots shown in FIGS. 7A-7D. Disk-on-disk (or flat-on-flat) reciprocating sliding tests were conducted in oil-starved conditions to evaluate the performance of the MWCNT coating. To simulate an oil-starved environment, only one droplet (~0.05 mL) of synthetic base oil (PAO 4 cSt) was placed on a Type 316 stainless steel disk with or without a MWCNT coating and then rubbed against an M2 tool steel disk. M2 tool steel disks with two surface roughness levels ($R_a$=50 nm as shown in FIG. 7A-7B and $R_a$=30 nm in FIG. 7C-7D) was used. Type 316 stainless steel disks in three forms were tested: (a) polished only (bare), (b) MWCNT-coated by CVD process, and (c) heat-treated by going through the CVD process but without introducing CNTs. All tests were conducted at room temperature (~23° C.) under a constant 100 N load at 0.5 Hz oscillation with a 10 mm stroke for 100 m or 1,000 m sliding (2.8 or 27.8 hours). FIG. 7A shows the average friction traces for multiple repeat tests of the three forms of stainless steel disks sliding against the M2 tool steel disk ($R_a$=50 nm) for 100 m (2.8 hrs). While having different running-in behavior, tests of both the bare and heat-treated stainless steel disks ended with COFs of 0.13-0.14. The running-in phenomenon is specified as a series of processes during which wear rate and friction for lubricated contacts stabilize, and an in-depth study of running-in can be found in P. J. Blau, *Tribology International*, 2005,38,1007-1012.

Figure 7C:
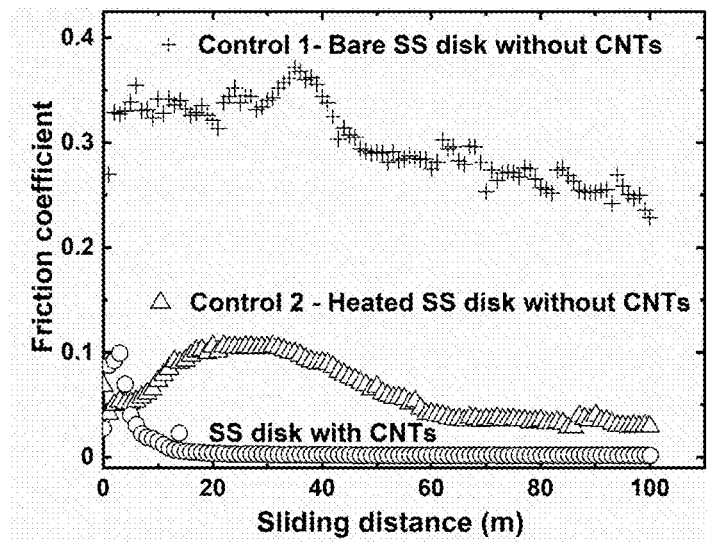
Figure 7D:
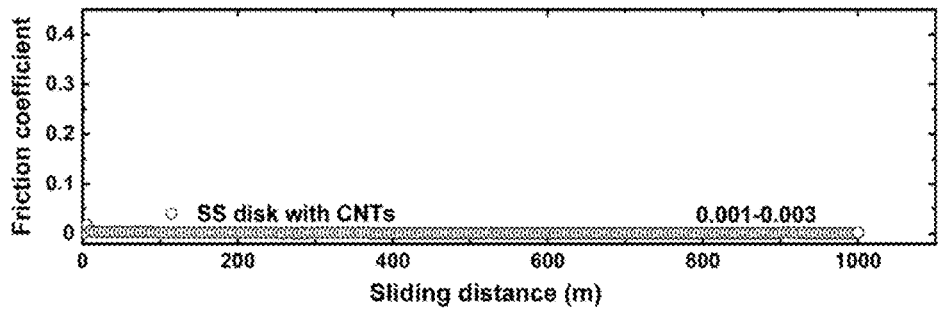

In contrast, the MWCNT-coated 316 stainless steel disk repeatedly produced an ultra-low COF in a range of 0.002-0.007 after running-in, or 95-99% reduction in COF compared to the bare and heat-treated stainless steel disks. Producing ultra-low friction is an accomplishment, but maintaining ultra-low friction is often a larger challenge. Elongated tests of 1,000 m sliding (27.8 hrs) were conducted. The friction curves in FIG. 7B demonstrated the promising sustainability of superlubricity: after 150 m of sliding, the steady-state COF was 0.007 for the rest of 850 m or 24 hours of sliding. FIG. 7C and 7D shows the average friction traces for multiple repeat tests of the three forms of stainless steel disks sliding against the M2 tool steel disk (Ra=~30 nm) for 100 m and 1000 m. The COF of the CNT-coated stainless steel disk further drop down to the range of 0.001-0.003 compared to the bare and heat-treated stainless steel disks with similar surface roughness. Unlike superlubricity of the conventional art generally requiring a specially-controlled gas environment, the presently described MWCNT coating has demonstrated superlubricity in an ambient environment, which is remarkable.

Figures 8A, 8B:
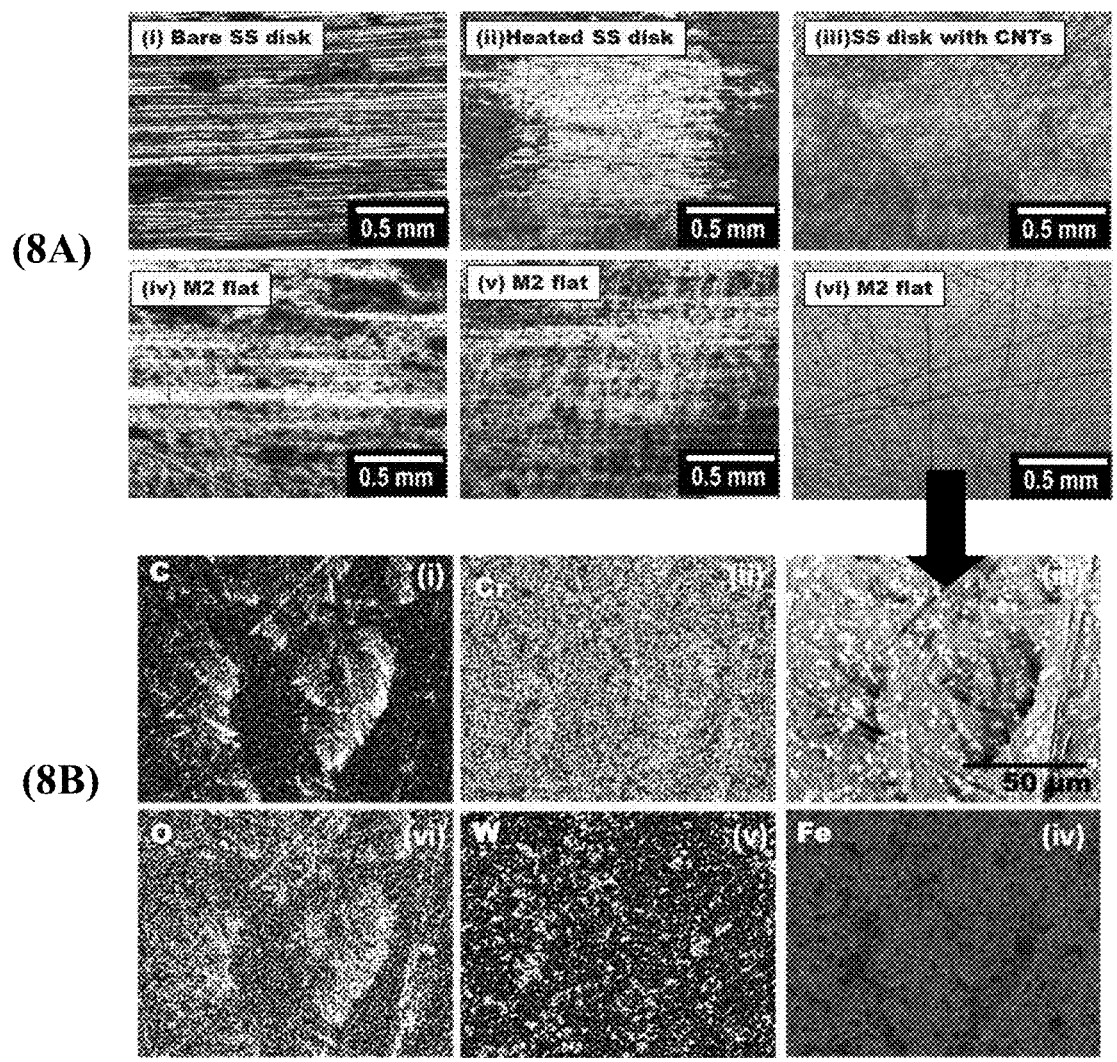
FIGS. 8A-8B. Comparison of worn surfaces with and without MWCNT coating after the 100 meter (100 m) sliding test.

The mechanism for ultra-low friction was investigated by comparing the worn surfaces of the three forms of 316 Type 316 stainless steel disks (bare, heat-treated, and CNT-coated) and the counterface M2 tool steel disks after the 100 m lubricant-starved sliding. The results are shown in FIGS. 8A and 8B. FIG. 8A (panels i-vi) shows images of the bare stainless steel disk (panel i), heated stainless steel disk (panel ii), stainless steel disk coated with MWCNTs (panel iii), and the counterface M2 tool steel disk ($R_a$=50 nm) (panel iv, v, and vi, respectively). The CNT-coated surface and its counterface showed much less surface damage than those without the CNT coating after testing. FIG. 8B (panels i-vi) shows EDS elemental mapping of the M2 tool steel surface that rubbed against the MWCNT coating, with panels i-vi showing images for C, Cr, SEM image (no element), O, W, and Fe, respectively. As shown, the M2 tool steel surface that rubbed against the CNT-coating has a carbon transfer layer, which is likely at least partly responsible for the ultra-low friction result. The bare and heat-treated stainless steel disks and their counterfaces show clear signs of abrasive wear (lots of scratches along the sliding direction) and adhesive wear (lots of small pads of smeared material). In contrast, minor surface damage was observed either in the MWCNT-coated stainless steel disk (most MWCNTs were removed but a carbonaceous layer seemed to form on the surface) or its counterface (the M2 tool steel appears almost intact with original polishing marks retained). The EDS elemental mapping in FIG. 8B confirmed a carbon-rich film on the worn surface of the M2 steel disk that rubbed against the MWCNT-coating as a result of transfer and smearing of the fractured MWCNTs. This carbon transfer film is believed to be responsible in part for the ultra-low friction.

Figure 9A:
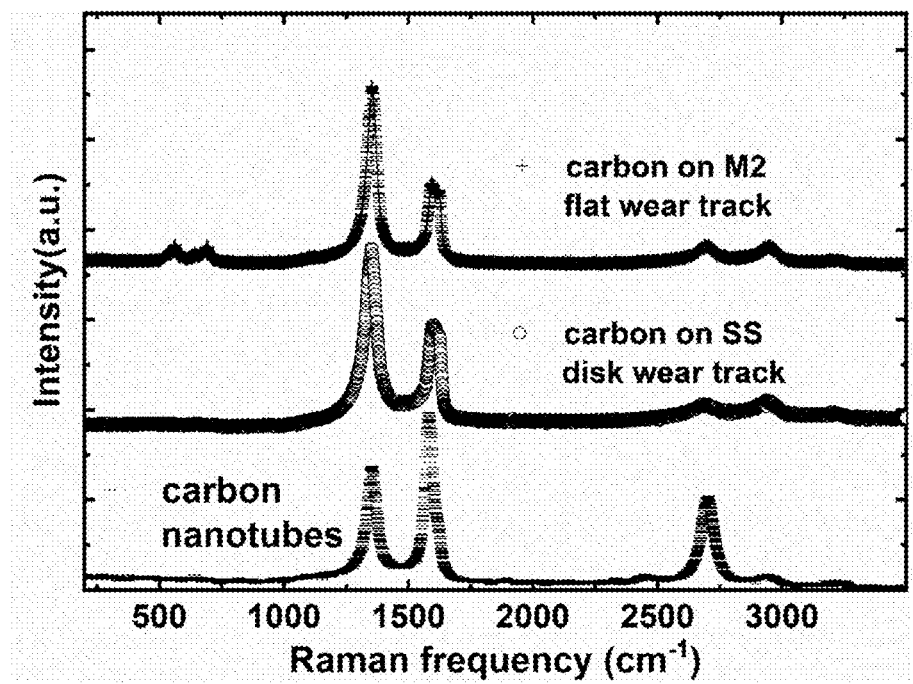
FIGS. 9A-9B.
Figure 9B:
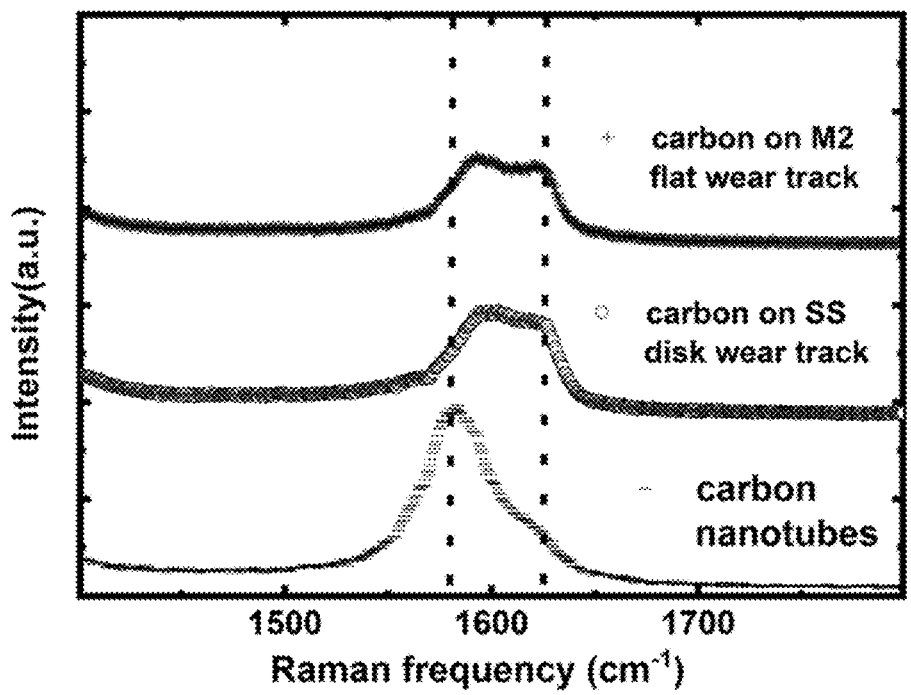

The carbon transfer between the Type 316 stainless steel disk and M2 tool steel disk was further evaluated using Raman spectroscopy of the MWCNT-coating and the carbon films on both surfaces of the rubbing pair. The results are shown in FIG. 9A. Raman analysis was conducted using a Raman microprobe with Argon ion laser (spot size ~1 µm) operating at 5145 Å with an output power of 17 mW. The carbon peaks of as-grown MWCNTs are at 1350 cm$^{-1}$ (defect/disorder peak, D) and 1580-1620 cm$^{-1}$ (graphitic peak, G). Second-order Raman peaks appear between 2600 and 3000 cm$^{-1}$. The intensity ratio of the G to D band ($I_G/I_D$) indicates the degree of disorder bonding in the carbon. The $I_G/I_D$ ratio of the as-grown MWCNTs coating is 1.5. The carbon on both the worn disk and disk had a significantly reduced $I_G/I_D$ ratio (0.55) compared to the as-grown CNTs, which indicates that the carbon structure became more disordered after the wear testing. In addition, the G band became broader and shifted to a higher frequency after the sliding test as shown in FIG. 9B, which correlates well with the compressed carbon film on the contact surface as peak shifting to a higher frequency is often associated with compressive residual stress. The carbon spectra of the worn Type 316 stainless steel disk and M2 tool steel disk seem identical, which suggests carbon film transfer between them during the sliding.

The roughness of the wear scars on the Type 316 stainless steel disks and their counterface M2 steel disks was determined using a white light interferometer. The results are shown in Table 1 below. As clearly shown by the results in Table 1, the MWCNT coating made both of the surfaces in rubbing smoother (i.e., indicative of less damage).

TABLE 1

Roughness of the worn 316 stainless steel disks and M2 steel disks (counterface).

| Roughness | Worn 316 stainless steel disk | | Worn M2 tool steel disk (counterface) | |
|---|---|---|---|---|
| | $R_a$ (μm) | $R_z$ (μm) | $R_a$ (μm) | $R_z$ (μm) |
| Bare 316 stainless steel disk | 1.18 | 21.16 | 0.21 | 5.04 |
| Heat treated 316 stainless steel disk | 0.55 | 9.53 | 0.13 | 2.67 |
| CNTs-coated 316 stainless steel disk | 0.37 | 7.15 | 0.12 | 2.60 |

Figure 10A:
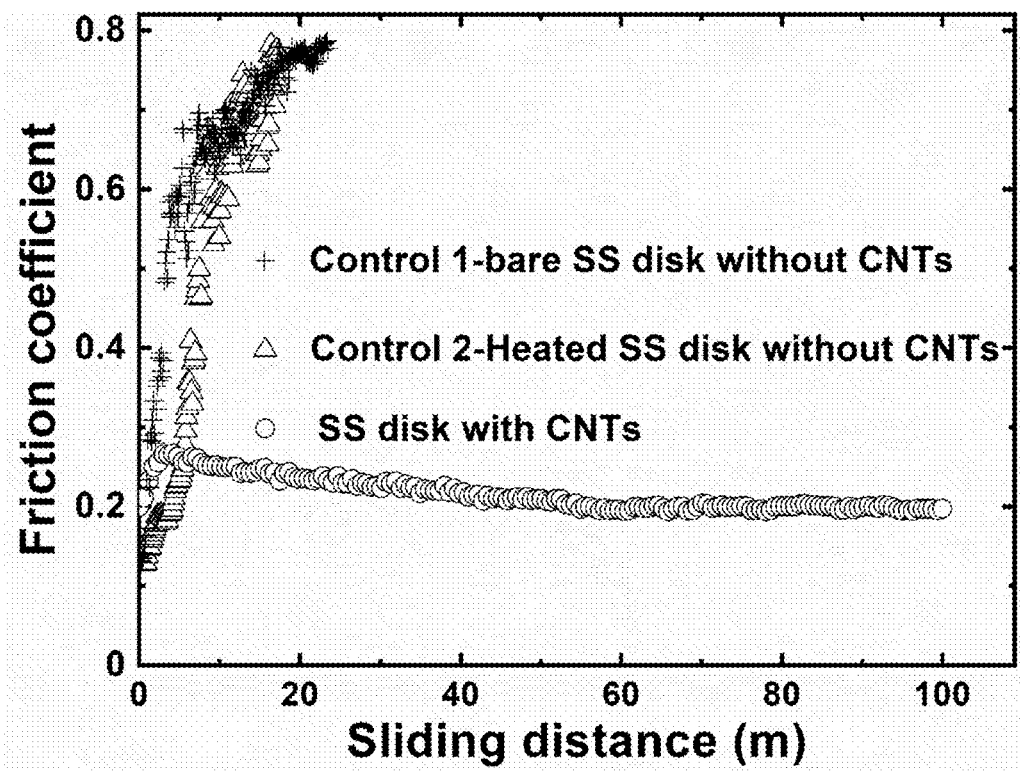
FIGS. 10A-10B.
Figure 10B:
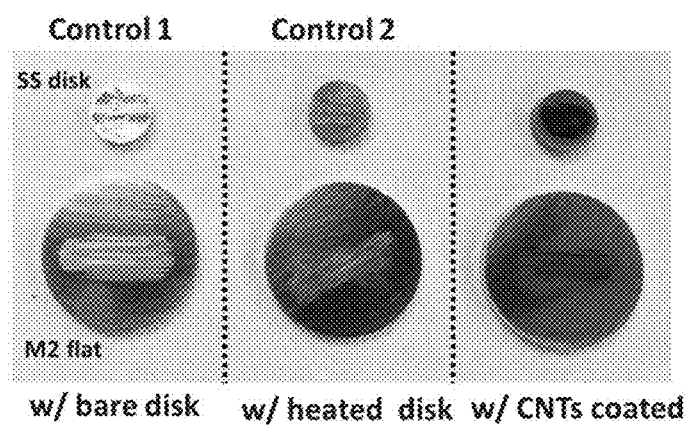

Additional tests were conducted on the MWCNT coating under dry sliding conditions. FIG. 10A shows friction vs. sliding distance plots for Control-1 (bare Type 316 stainless steel disk), Control-2 (heat-treated Type 316 stainless steel disk), and Type 316 stainless steel disk with MWCNT coating. FIG. 10B shows photographs of the stainless steel bare disk, heat-treated stainless steel disk, and stainless steel disk with MWCNT coating following the sliding tests. As shown in FIG. 10A, both control tests on the stainless steel disks without MWCNTs were forced to stop after a short sliding distance (<25 m) due to the friction coefficient being too high (>0.8). In contrast, the disk covered with CNTs reduced the friction by 75%.

Growing MWCNTs using different carbon sources

Figures 11A, 11B, 11C, 11D:
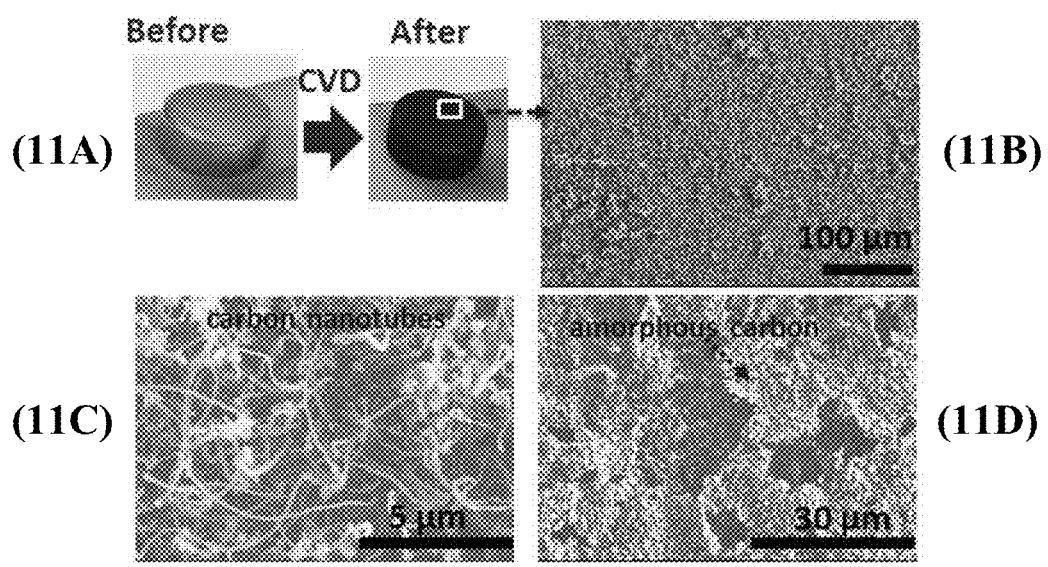
FIGS. 11A-11D.

FIG. 11A shows a simple schematic of the MWCNT growth process. FIGS. 11B-11D are micrographs in different magnifications showing a top view of the MWCNTs grown on a Type 316 stainless steel disk using hexane as the carbon source. In this case, amorphous carbon deposition was observed in addition to MWCNTs. This may be due to the following two reasons: (1) excess incoming carbon flux when using hexane (two carbon atoms per EtOH molecule vs. six carbon atoms per hexane molecule) were unable to be fully converted into MWCNTs but deposited as amorphous carbon instead, and (2) lack of a mild oxygen environment to etch away the amorphous carbon layer formed on the surface. When EtOH is used, any deposited amorphous carbon may be converted to $CO_2$ by oxygen derived from EtOH dissociation. Thus, the hexane flow needs to be optimized to avoid amorphous carbon deposition or post-treatment under controlled oxygen environment to remove the amorphous carbon. In some embodiments, the flow rate of hexane or other hydrocarbon substance is adjusted to produce MWCNTs with substantially no (or absolutely no) amorphous carbon production.

Growing CNTs on curved surfaces

Figures 12A, 12B:
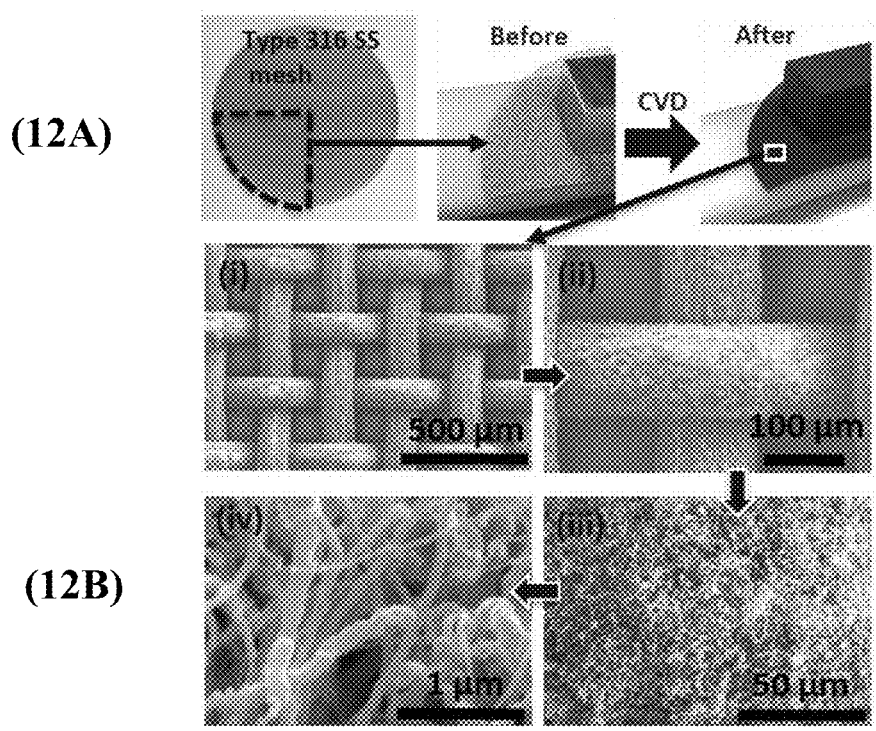
FIGS. 12A-12B.
Figures 13A, 13B, 13C:
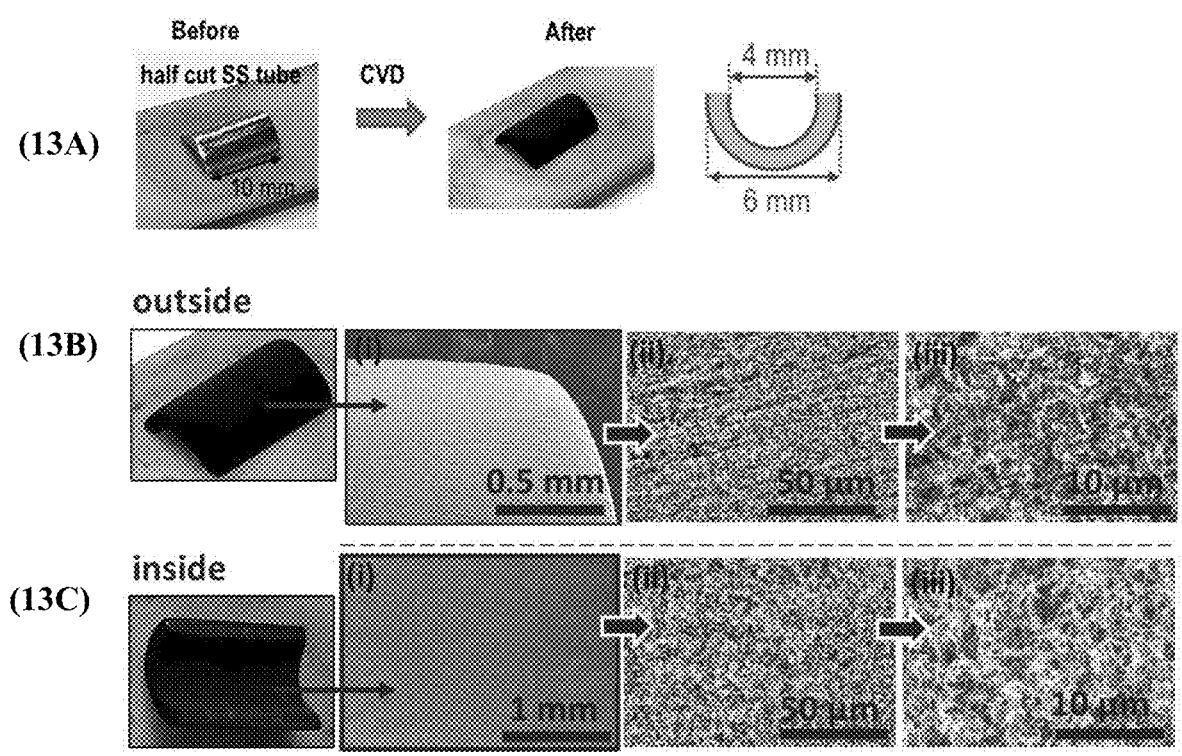
FIGS. 13A-13C.

In addition to the Type 316 stainless steel disk, a Type 316 stainless steel wire mesh was used for testing CNTs growth on curve surfaces. The results are shown in FIGS. 12A and 12B. FIG. 12A shows a simple schematic for a process for growing the MWCNTs on a wire mesh metal substrate. FIG. 12B (panels i-iv) shows SEM images of the resulting MWCNT-coated mesh in ×100, ×300, ×1000, and ×50,000 magnification, respectively, in panels i-iv. The wires became black after the CVD process, which indicates formation of MWCNTs. The SEM images indicate good surface coverage of MWCNT arrays.

Growing CNTs on tool steels (non-stainless, essentially no nickel)

Transition metal salts, such as Fe, Ni, and Co, are frequently used as catalysts to grow MWCNTs. In the present CVD method, the choice of substrate is of greater consequence because the substrate itself produces nanoscale catalyst particles during the processing to initiate MWCNT growth. The presence of Fe, Ni, and/or Cr in the metal substrate has been found to be particularly effective.

Figures 14A, 14B:
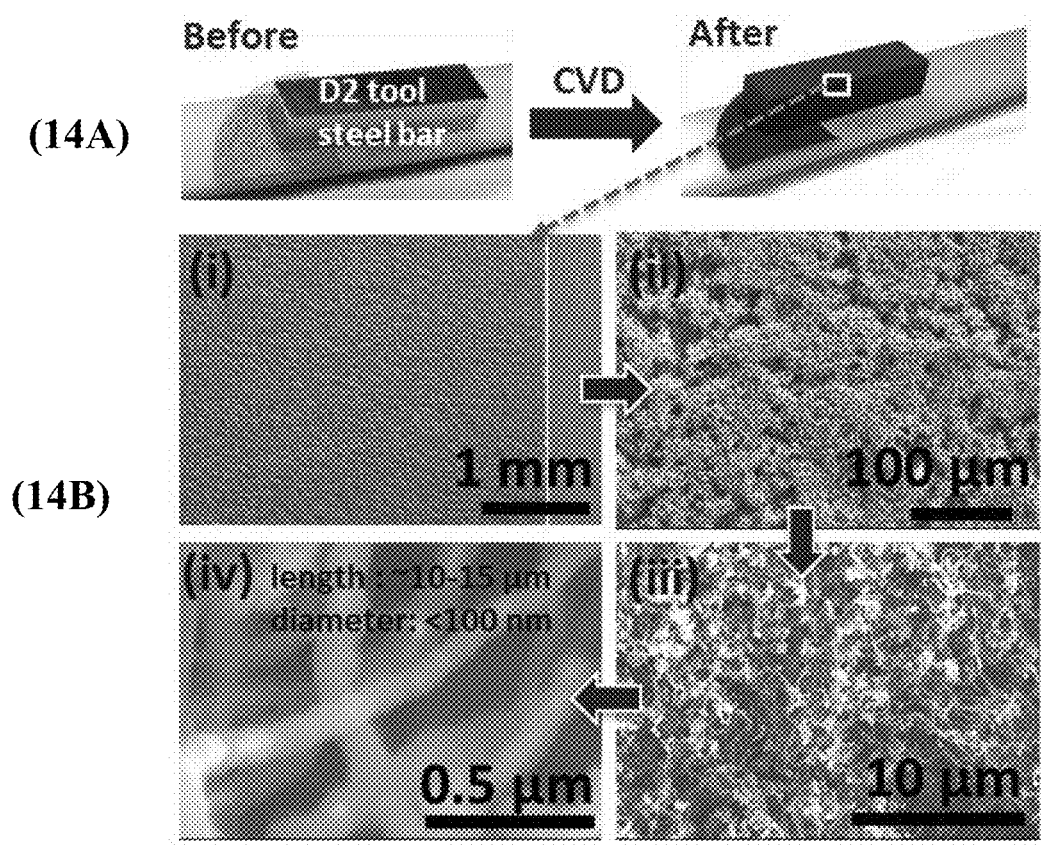
FIGS. 14A-14B.
Figures 15A, 15B:
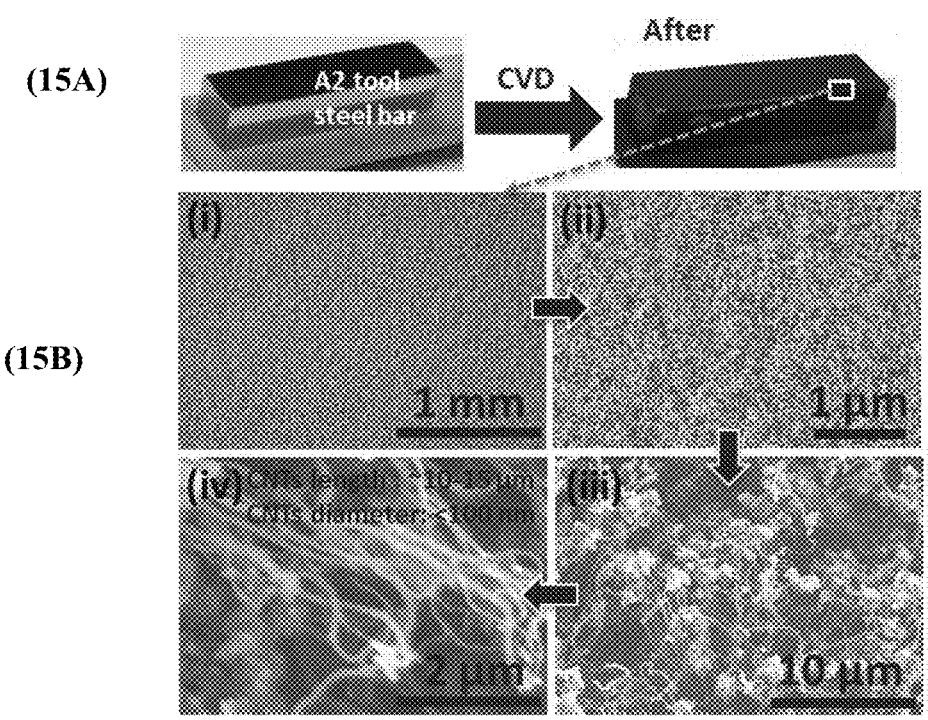
FIGS. 15A-15B.
Figures 16A, 16B:
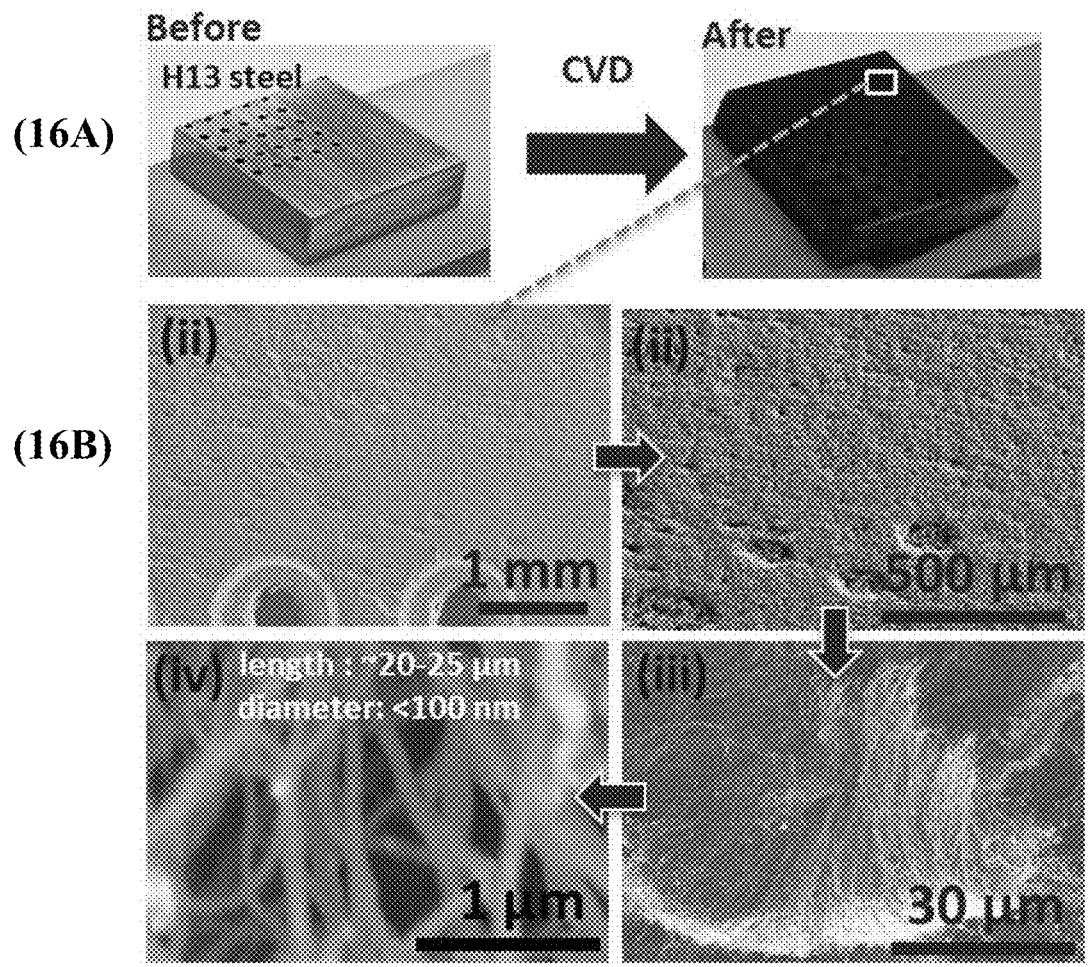
FIGS. 16A-16B.

In addition to stainless steels, experiments were performed to show the feasibility of growing MWCNTs on tool steels, including D2, A2, and H13 tool steels. FIG. 14A shows a simple schematic for a process for growing the MWCNTs on a D2 tool steel bar. FIG. 14B (panels i-iv) shows SEM images of the resulting MWCNT-coated tool steel bar in increasing magnification, respectively, in panels i-iv. FIG. 15A shows a simple schematic for a process for growing the MWCNTs on an A2 tool steel bar. FIG. 15B (panels i-iv) shows SEM images of the resulting MWCNT-coated tool steel bar in increasing magnification, respectively, in panels i-iv. FIG. 16A shows a simple schematic for a process for growing the MWCNTs on an H13 tool steel bar. FIG. 16B (panels i-iv) shows SEM images of the resulting MWCNT-coated tool steel bar in increasing magnification, respectively, in panels i-iv. Unlike Type 316 stainless steel, the D2, A2, and H13 tool steels do not retain Ni. The alloy compositions are compared in Table 2 below. This evidently confirmed the feasibility of growing MWCNTs on non-stainless steels, which expands the applicability of the present CVD process for different steel alloys.

TABLE 2

Alloy compositions of selected stainless and tool steels.

| wt. % | Stainless steel | | Tool steels | | |
|---|---|---|---|---|---|
| | 316 stainless steel | 304 stainless steel | D2 | A2 | H13 |
| Cr | 16-18% | 18-20% | 11-13% | 4.75-5.5% | 4.75-5.5% |
| Ni | 10-14% | 8-12% | — | — | — |
| Mo | 2-3% | — | 0.7-1.2% | 0.9-1.4% | 1.1-1.75% |

Hypothetical explanation for the MWCNT coating's superlubricity

Figure 17A:
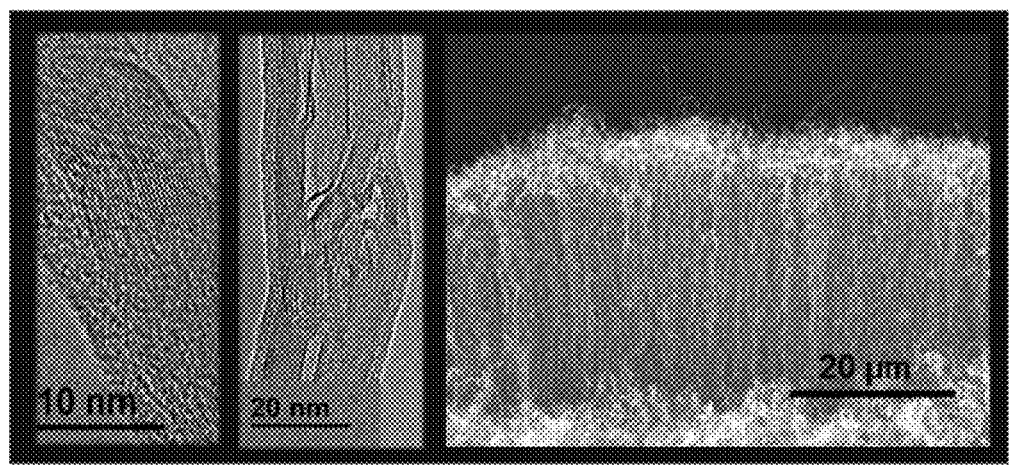
FIGS. 17A-17C.
Figures 17B, 17C:
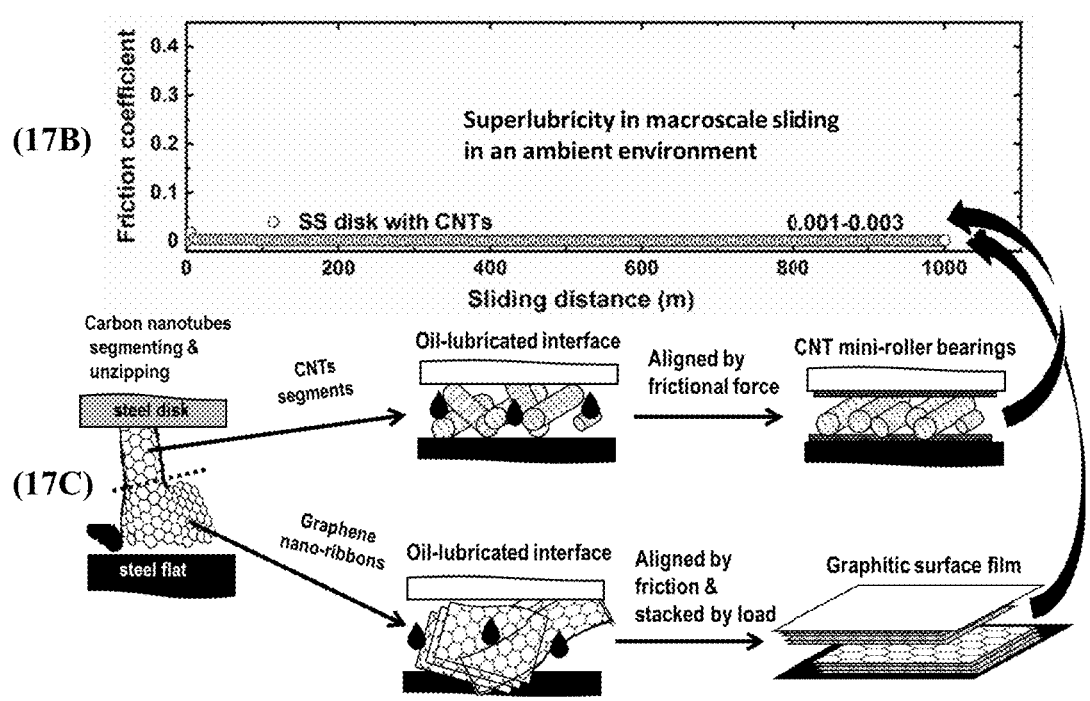

MWCNTs are essentially cylindrical structures that consist of rolled-up sheets of graphene. Unraveling (unzipping) of CNTs and MWCNTs has been extensively studied. It is herein hypothesized that some of the MWCNTs in the coating are crushed or fractured into graphene nanoribbons or platelets by the combined mechanical stress and oxidation occurring during the running-in of tribo-testing, and these graphene species are smeared onto the contact area to result in a thin carbon film. Raman spectra of such a carbon film (e.g., FIG. 9) suggest similar characteristics to graphene oxide. The graphene nanoribbons or platelets inside this thin carbon film is suspected to be aligned in parallel fashion to the surface as a result of the repeated reciprocating tangential (friction) force, possibly with the aid from the lubricating oil as further explained below, to achieve superlubricity. The foregoing concepts are further elucidated in FIGS. 17A-17C. FIG. 17A presents SEM micrographs showing the vertically-aligned MWCNTs in the MWCNT coating produced according to the present process. FIG. 17B presents tribo-bench testing results showing superlubricity behavior (defined as COF<0.01) of the CNT coating in macroscale sliding under minimum quantity lubrication (MQL) in an ambient environment. FIG. 17C is a schematic showing hypothetical mechanisms responsible for the superlubricity behavior of the MWCNT coating.

While some MWCNTs may be unraveled to graphene nanoribbons or platelets, as stated above, many others would be simply fractured into a large number of short segments, which may be trapped at the contact interface and aligned by the repeated reciprocating tangential (friction) force, with aid from the lubricating oil, as explained below, to function as nanoscale roller bearings to reduce friction. The foregoing concept is depicted in FIG. 17C.

While there was only one droplet of lubricating oil applied, it may play a critical role in both forming the superlubricity carbon film and maintain its ultra-low friction. Because this new MWCNT coating is highly oleophilic, the presence of oil (even though only one droplet) can efficiently wet and lubricate the crashed MWCNTs to permit: (i) the graphene nanoribbons or platelets to be more easily aligned under the repeated friction force to form a layer-structured graphene deposit film, and (ii) the broken CNT short segments to be well aligned under the repeated friction force to roll in the sliding direction like mini-roller bearings. As a result, the combined effect of graphene deposit films on both contact surfaces and CNT roller bearings at the contact interface exhibits ultra-low friction.

Comparison with competitive technologies

Compared with competitive technologies, the presently described MWCNT coating may be superior in lubricant/oil wetting, water repelling, and most importantly, providing ultra-low friction (superlubricity) under lubricant-started sliding in the ambient environment. The foregoing results are summarized in Table 3 below. The manufacturing cost of the MWCNT coating is on par with commercial PVD/CVD carbon coatings and lower than CNT-reinforced composites because they generally require initial production of CNTs followed by processing of the CNTs with a matrix material.

TABLE 3

Comparison between the CNT-coating and competitive technologies

| | Steady-state friction coefficient in ambient environment | Lubricant/oil wetting | Water repelling | Wear protection | Corrosion protection | Cost |
| --- | --- | --- | --- | --- | --- | --- |
| CNT-reinforced composites[4] | 0.05-0.13 | Moderate | No | Moderate | No | $$-$$$ |
| Diamond-like carbon coatings (DLC) | 0.03-0.12 | Moderate | Moderate | Yes, but may damage the counter-face | Excellent | $ |
| ORNL CNT-coating | 0.001-0.003 | Excellent | Super-hydrophobic | Excellent | Excellent | $ |

While there have been shown and described what are at present considered the preferred embodiments of the invention, those skilled in the art may make various changes and modifications which remain within the scope of the invention defined by the appended claims.

What is claimed is:

1. A method for producing a structure containing an array of multi-walled carbon nanotubes on a metal substrate, the method comprising:
   (i) subjecting a metal substrate to a surface oxidation process in which the metal substrate is subjected to a first temperature of 600-1000° C. in an $O_2$-containing atmosphere and under a first reduced pressure of at least 0.01 atm and less than 1 atm to result in oxidation of a surface of said metal substrate, wherein said first temperature is at least 100° C. below the melting point of the metal;
   (ii) subjecting the metal substrate to a surface reduction process in which the metal substrate is subjected to a second temperature of 600-1000° C. in a reducing atmosphere and under a second reduced pressure of at least 0.01 atm and less than 1 atm to result in reduction of the surface of said metal substrate, wherein said reducing atmosphere contains hydrogen gas;
   (iii) subjecting the metal substrate to a third reduced pressure of no more than 0.1 atm; and
   (iv) contacting the metal substrate, while at the third reduced pressure and under an inert or reducing atmosphere, with an organic substance at a third temperature of 700-900° C. for at least 1 minute, to result in production of said structure containing an array of multi-walled carbon nanotubes on said metal substrate.

2. The method of claim 1, further comprising: (v) cooling the metal substrate to room temperature under an inert or reducing atmosphere after completion of step (iv).

3. The method of claim 1, wherein an externally provided metallic, metal salt, or metal oxide catalyst is excluded.

4. The method of claim 1, wherein step (i) comprises subjecting the metal substrate to a surface oxidation process in which the metal substrate is elevated in temperature from room temperature to said first temperature of 600-1000° C. at a temperature ramp rate of no more than 50° C./min in an $O_2$-containing atmosphere and under a first reduced pressure of at least 0.1 atm and less than 1 atm to result in oxidation of a surface of said metal substrate, wherein said first temperature is at least 100° C. below the melting point of the metal.

5. The method of claim 4, wherein said temperature ramp rate is no more than 40° C./min.

6. The method of claim 4, wherein said temperature ramp rate is no more than 30° C./min.

7. The method of claim 4, wherein said temperature ramp rate is within a range of 5-50° C/min.

8. The method of claim 1, wherein the organic substance in step (iv) has a molecular weight of up to 500 g/mol.

9. The method of claim 1, wherein the organic substance in step (iv) is an alcohol or hydrocarbon.

10. The method of claim 1, wherein said metal substrate has an iron-based composition.

11. The method of claim 1, wherein said iron-based composition is steel.

12. The method of claim 11, wherein said steel is stainless steel.

13. The method of claim 11, wherein said steel is tool steel.

14. The method of claim 11, wherein said steel is an alloy steel.

15. The method of claim 1, wherein the multi-walled carbon nanotubes are aligned substantially perpendicular to said metal substrate and substantially parallel to each other.

* * * * *